United States Patent
Wang et al.

(10) Patent No.: US 10,790,322 B1
(45) Date of Patent: Sep. 29, 2020

(54) IMAGE SENSOR FOR INFRARED SENSING AND FABRICATION METHOD THEREOF

(71) Applicant: OmniVision Technologies, Inc., Santa Clara, CA (US)

(72) Inventors: Qin Wang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/543,681

(22) Filed: Aug. 19, 2019

(51) Int. Cl.
*H01L 27/146* (2006.01)
*H04N 5/33* (2006.01)

(52) U.S. Cl.
CPC ...... *H01L 27/1461* (2013.01); *H01L 27/1463* (2013.01); *H01L 27/14649* (2013.01); *H01L 27/14689* (2013.01); *H04N 5/33* (2013.01)

(58) Field of Classification Search
None
See application file for complete search history.

(56) References Cited

U.S. PATENT DOCUMENTS

| 7,190,012 B2 | 3/2007 | Son et al. |
| 2003/0143774 A1* | 7/2003 | Takahashi ........... H01L 27/0664 438/69 |
| 2008/0157139 A1 | 7/2008 | Lee |
| 2012/0175691 A1 | 7/2012 | Wu et al. |
| 2016/0056198 A1* | 2/2016 | Lee ................... H01L 27/14612 257/225 |
| 2017/0330906 A1* | 11/2017 | Korobov ........... H01L 27/14641 |
| 2018/0294305 A1* | 10/2018 | Janssens ........... H01L 27/14652 |

* cited by examiner

*Primary Examiner* — Clifford Hilaire

(57) ABSTRACT

An image sensor include a semiconductor substrate, a first epitaxial layer, a second epitaxial layer, a plurality of photodiodes, and a plurality of pixel isolation structures. The first epitaxial layer is formed on the semiconductor substrate, and the second epitaxial layer is formed on the first epitaxial layer. Each photodiode includes a first diffusion region formed in the first epitaxial layer and a second diffusion region formed in the second epitaxial layer. The second diffusion region is extended through the second epitaxial layer and electrically coupled to the first diffusion region. Each pixel isolation structure include a first isolation structure formed between adjacent first diffusion regions in the first epitaxial layer and a second isolation structure formed between adjacent second diffusion regions in the second epitaxial layer. The second isolation structure is extended through the second epitaxial layer to connect to the first isolation structure.

20 Claims, 13 Drawing Sheets

IMAGE SENSOR FOR INFRARED SENSING AND FABRICATION METHOD THEREOF

TECHNICAL FIELD

This disclosure relates generally to Complementary Metal-Oxide-Semiconductor (CMOS) image sensors, and in particular but not exclusively, relates to an image sensor with enhanced light sensitivity to infrared (IR) light and a fabrication method thereof.

BACKGROUND INFORMATION

Image sensors have become ubiquitous. They are widely used in digital still cameras, cellular phones, security cameras, as well as medical, automobile and other applications. The typical image sensor operates as follows. Image light from an external scene is incident on the image sensor. The image sensor includes a plurality of photosensitive elements such that each photosensitive element absorbs a portion of the incident image light. Each photosensitive element included in the image sensor, such as photodiodes, generates image charges upon absorption of the image light. The amount of generated image charges is proportional to the intensity of the image light. The generated image charges may be used to produce an image representing the external scene.

Some image sensors are used for near infrared (NIR) sensing (for simplicity and brevity also referred to as the infrared or IR sensing). IR sensing is commonly defined to include the light wavelengths from about 750 nm to about 950 nm. The IR sensing may be useful for imaging that would otherwise be beyond visual perception. When IR light is emitted toward and reflected from an object, an IR sensor registers the reflected light. The IR sensing may also be used to gauge object distance, size, location, and identifying features for various applications including 3D imaging and phase detection for auto-focus.

SUMMARY

According to an aspect of the present disclosure, an image sensor with improved sensitivity to infrared sensing is provided. The image sensor includes a semiconductor substrate, a first epitaxial layer of a first conductive type, a second epitaxial layer of the first conductive type, a plurality of photodiodes, and a plurality of pixel isolation structures arranged between adjacent photodiodes. The semiconductor substrate has a first side and a second side opposite to the first side. The first epitaxial layer is formed on the first side of the semiconductor substrate. The second epitaxial layer is formed on the first epitaxial layer. The plurality of photodiodes arranged to form in both the first epitaxial layer and the second epitaxial layer. Each of the plurality of photodiode include a first diffusion region of a second conductive type and a second diffusion region of the second conductive type. The first diffusion region is formed in the first epitaxial layer and the second diffusion region is formed in the second epitaxial layer. The second diffusion region is extended through the second epitaxial layer and electrically coupled to the first diffusion region. Each photodiode accumulates image charges generated in response to an incoming light in at least one of the first diffusion region and the second diffusion region. Each of the plurality of pixel isolation structures include a first isolation structure and a second isolation structure. The first isolation structure is formed in the first epitaxial layer, and is disposed between adjacent first diffusion regions. The second isolation structure is formed in the second epitaxial layer and disposed between adjacent second diffusion regions. The second isolation structure is extended through the second epitaxial layer toward the semiconductor substrate to connect to the first isolation structure.

In some embodiments, the image sensor further include a plurality of backside deep trench isolation structures. The plurality of backside deep trench isolation structures is formed on the second side of the semiconductor substrate. Each of the deep trench isolation structures is extended from the second side of the semiconductor substrate into the first epitaxial layer to connect to the first isolation structure of each pixel isolation structure.

In some embodiments, the first diffusion region has substantially the same doping profile as the second diffusion region.

In some embodiments, the first isolation structure include a first implant isolation region doped with the first conductive type, and the second isolation structure comprises a second implant isolation region doped with the first conductive type.

In some embodiments, each of the backside deep trench isolation structures is extended from the second side of the semiconductor substrate into the first implant isolation region of the respective first isolation structure.

In some embodiments, the first isolation structure include a first front-side deep trench isolation structure formed in the first epitaxial layer, and the first front-side deep trench isolation structure is extended through the first epitaxial layer toward the second side of the semiconductor substrate. The second isolation structure includes a second front-side deep trench isolation structure formed in the second epitaxial layer, and the second front-side deep trench isolation structure is extended from a surface of the second epitaxial layer through the second epitaxial layer toward the semiconductor substrate to connect to the first deep trench isolation structure.

According to another aspect of the present disclosure, an image sensor with improved sensitivity to infrared sensing is provided. The image sensor includes a semiconductor substrate, a first epitaxial layer of a first conductive type, and a second epitaxial layer of the first conductive type. The semiconductor substrate has a first side and a second side opposite to the first side. The first epitaxial layer is formed on the first side of the semiconductor substrate. The first epitaxial layer includes a plurality of first diffusion region of a second conductive type and a plurality of first diffusion region of a second conductive type wherein the second conductive type is opposite to the first conductive type. Each of the plurality of the first isolation structures is arranged between adjacent first diffusion regions in the first epitaxial layer to electrically isolate adjacent first diffusion regions. The second epitaxial layer of the first conductive type is formed on the first epitaxial layer. The second epitaxial layer includes a plurality of second diffusion regions of the second conductive type and a plurality of second isolation structures. Each of the second diffusion regions is extended through the second epitaxial layer and electrically coupled to each of the first diffusion regions forming a plurality of photodiodes. Each of the second isolation structures is arranged between adjacent second diffusion regions in the second epitaxial layer to electrically isolate adjacent second diffusion regions. Each of the second isolation structures is extended through the second epitaxial layer toward the second side of the semiconductor substrate and connected to each of the first isolation structures.

In some embodiments, the image sensor further includes a third epitaxial layer of the first conductive type, and the third epitaxial layer is formed on the second epitaxial layer. The third epitaxial layer includes a plurality of third diffusion regions of the second conductive type and a plurality of third isolations structure. Each of the third diffusion region is extended through the third epitaxial layer to electrically couple to the second diffusion region. Each of the photodiodes include the first diffusion region, the second diffusion region, and the third diffusion region. Each of the photodiodes stores image charges generated in response to an incoming light in at least one of the first diffusion region, the second diffusion region, and the third diffusion region. Each of the third isolation structures is disposed between adjacent third diffusion regions in the third epitaxial layer to electrically isolate adjacent third diffusion regions. Each of the third isolation structures is extended through the third epitaxial layer toward the second epitaxial layer and connected to each of the second isolation structures.

In some embodiments, the first diffusion region, the second diffusion region, and the third diffusion region has substantially the same doping profile.

In some embodiments, the image sensor is a front-side illuminated image sensor.

In some embodiments, the image sensor is a backside illuminated image sensor.

According to another aspect of the present disclosure, a method for fabricating an image sensor with improved sensitivity to infrared sensing is provided. The method include forming a first epitaxial layer of a first conductive type on a first side of a semiconductor substrate; forming a plurality of first diffusion regions of a second conductive type in the first diffusion regions; forming a plurality of first isolation structures in the first epitaxial layer, each of the first isolation structures is arranged to formed between adjacent first diffusion regions; forming a second epitaxial layer of the first conductive type on the first epitaxial layer; forming a plurality of second diffusion regions of the second conductive type in the second epitaxial layer, wherein each of the second diffusion regions is extended through the second epitaxial layer to electrically couple to each of the first diffusion regions forming a plurality of photodiodes; and forming a plurality of second isolation structures in the second epitaxial layer, wherein each of the second isolation structures is formed between adjacent second diffusion regions and extended through the second epitaxial layer to connect to each of the first isolation structures.

In some embodiments, the first conductive type is a P-type, and the second conductive type is an N-type.

In some embodiments, the first conductive type is an N-type, and the second conductive type is a P-type.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
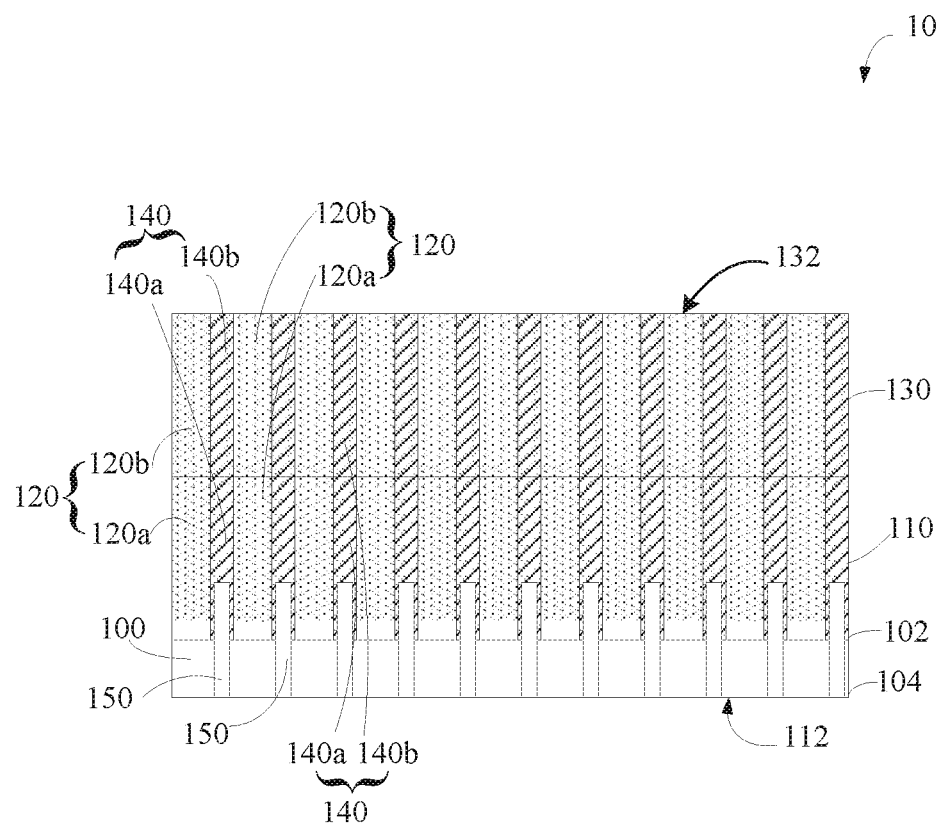
FIG. 1A illustrates a cross-sectional view of an exemplary image sensor structure in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of a device structure and fabrication method for an imaging sensor having enhanced light sensitivity to IR light are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be further understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another region, layer or section and not to limit or set the order. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is referred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

Throughout this specification, several terms of art are used. These terms are to take on their ordinary meaning in the art from which they come, unless specifically defined herein or the context of their use would clearly suggest otherwise.

CMOS image sensors generally comprise a plurality of pixel respectively having an image sensing element, such as photodiode. Over time, the semiconductor industry has reduced a size of pixel, so as to increase a number of pixel in a CMOS image sensor (CIS) integrated chip. Increasing the number of pixel in a CIS integrated chip increases the resolution of an image captured by the CIS integrated chip. However, as the size of the pixel gets smaller, pixels become closer to each other and crosstalk between adjacent pixel increases. As such, smaller and deep isolation between pixels have become increasingly critical to full well capacity (FWC) and quantum efficiency (QE) of pixels.

The wavelength for Infrared (IR) light typically ranges from 750 nm to about 950 nm, and the typical absorption depth of silicon substrate for IR light wavelength at 950 nm is approximate 10 um. Thus, to improve the quantum efficiency or light sensitivity of a photodiode to infrared (IR) light, a thicker silicon substrate with deeper implanted photodiode may be required in order to increase absorption of IR light, which would require deeper isolation. However, it is believed that current processing technologies, such as photolithography, implantation and etching processing, limits the implant depth of photodiode to about 2 to 3 um, which may not be deep enough to completely absorb IR light, thereby limit the performance of the image sensor. In addition, there is also limitations on the trench depth and trench width referred as maximum aspect ratio (depth to width ratio), that impose constraint on the depth an isolation structure may be formed. In particular, the smaller the pixel size, the less deep the photodiode may be implanted, and the less depth the isolation structure may be formed with existing processing technology.

FIG. 1A illustrates an example cross sectional view of an image sensor 10 provided in accordance to an exemplary embodiment of the present disclosure. The image sensor 10 includes a semiconductor substrate 100, a first epitaxial layer 110, a second epitaxial layer 130, a plurality of photodiodes 120, a plurality of pixel isolation structures 140 arranged between adjacent photodiodes 120, and a plurality of deep isolation trench (DTI) structures 150. Each of the plurality of photodiodes 120 operable to generate and accumulate image charges in responses to incoming light.

In some embodiments, the semiconductor substrate 100 may be a silicon substrate or a doped semiconductor substrate, such as a $P^-$ type silicon substrate or an $N^-$ type silicon substrate. In one embodiment, the semiconductor substrate 100 may be an epitaxial silicon substrate.

The semiconductor substrate 100 has a first side 102 (e.g., front side) and a second side 104 (e.g., backside) opposite to the first side 102. The first epitaxial layer 110 is formed on the first side 102 of the semiconductor substrate 100, for example by performing an epitaxial growth process (first epitaxial growth process). The second epitaxial layer 130 is formed on the first epitaxial layer 110, for example by performing another epitaxial growth process (second epitaxial growth process). The second epitaxial layer 130 has a surface 132 that may be referred as the front side surface of the stacking substrate structure of the second epitaxial layer 130, the first epitaxial layer 110, and the semiconductor substrate 100. The semiconductor substrate 100 has a surface 112 that may be referred as the backside surface of the stacking substrate structure of the second epitaxial layer 130, the first epitaxial layer 110, and the semiconductor substrate 100.

The first epitaxial layer 110 may be epitaxially aligned with the semiconductor substrate 100. The second epitaxial layer 130 may be epitaxially aligned with the first epitaxial layer 110. The first epitaxial layer 110 and the second epitaxial layer 130 may be doped silicon layers. In some embodiments, both the first epitaxial layer 110 and the second epitaxial layer 130 are P-type doped silicon layers. In some embodiments, both the first epitaxial layer 110 and the second epitaxial layer 130 are N-type doped silicon layers. In some embodiments, the first epitaxial layer 110 and the second epitaxial layer 130 may be doped with dopants/impurities of same polarity and substantially same impurity concentration.

In some embodiments, the doping concentration of the first epitaxial layer 110 and the doping concentration of the second epitaxial layer 130 may be higher than the doping concentration of the semiconductor substrate 100.

In some embodiment, both the first epitaxial layer 110 and the second epitaxial layer 130 may be doped with dopant of same conductive type as the semiconductor substrate 100. In some embodiment, both the first epitaxial layer 110 and the second epitaxial layer 130 may be doped with dopant having different conductive type as the semiconductor substrate 110. For example, both the first epitaxial layer 110 and the second epitaxial layer 130 may be doped with P-type dopant (for example, boron, gallium) while the semiconductor substrate 100 may be doped with N-type dopant (for example, arsenic, phosphorus).

In some embodiments, each of the plurality of photodiodes 120 includes a first diffusion region 120a and a second diffusion region 120b. Each of the first diffusion regions 120a is formed in the first epitaxial layer 110. Each of the second diffusion regions 120b is formed in the second epitaxial layer 130.

Each of the second diffusion regions 120b is arranged to extend substantially through the second epitaxial layer 130 to electrically couple to each other. In some embodiments, the first diffusion region 120a and the second diffusion region 120b may be in contact with each other. For example, the second diffusion region 120b may be formed in the second epitaxial layer 130 by ion implantation at the surface 132 and arranged to extend from the surface 132 through the second epitaxial layer 130 to directly connect to the first diffusion region 120a, for example by number of implantations with different implant energies.

Each of the first diffusion regions 120a forms a first light sensing region for each respective photodiode 120, and each of the second diffusion regions 120b forms a second light sensing region each respective photodiode. The first diffusion region 120a and the second diffusion regions 120b of each photodiode 120 operatively generate and accumulate image charges in response to the portion of incoming light each absorbed for the associated photodiode 120 during an integration or exposure period of the image sensor 10. Restated, each photodiode 120 accumulates image charges generated in response to the portion of incoming light each absorbed in at least one of the associated first diffusion region 120a and the second diffusion region 120b. In other words, the combined accumulated image charges in the first diffusion region 120a and the second diffusion region 120b of a photodiode 120 may represent as the light sensing response for the respective photodiode 120 and outputted by that photodiode 120 during a charge transfer period of the image sensor 10.

In some embodiment, the image sensor 10 may be a front-side illuminated (FSI) image sensor, each photodiode 120 generates and accumulate image charges in response to the incoming light directed through the surface 132 (front side surface) in at least one of the first diffusion region 120a and the second diffusion region 120b during an integration or exposure period of the image sensor 10. For the image sensor 10 be a front-side illuminated image sensor, the surface 132 may be also be referred to as an illuminated surface, and the surface 112 may be referred as a non-illuminated surface.

In some embodiment, the image sensor 10 may be a backside illuminated (BSI) image sensor, each photodiode 120 generates and accumulates image charges in response to the incoming light directed through the second side 104 (e.g., backside), i.e. through the surface 112 (backside surface), in at least one of the first diffusion region 120a and the second diffusion region 120b during an integration or exposure period of the image sensor 10. For the image sensor 10 be a front-side illuminated image sensor, the surface 112 may be also be referred to as an illuminated surface, and the surface 132 may be referred as a non-illuminated surface.

The first diffusion regions 120a and second diffusion regions 120b of the plurality of photodiodes 120 may be formed with a conductive type that are opposite to the conductive type of the first and second epitaxial layers 110, 130. In some embodiments, the first diffusion regions 120a and second diffusion regions 120b may be doped with N-type dopant (for example, arsenic or phosphorus) for generating electrons as image charges, while the first epitaxial layer 110 and the second epitaxial layer 130 may be doped with P-type dopant, (for example, boron). In some embodiments, the polarity may be reverse, i.e., the first diffusion regions 120a and second diffusion regions 120b may be doped with P-type dopant for generating holes as image charges, while the first epitaxial layer 110 and second epitaxial layer 130 may be doped with N-type dopant.

In some embodiments, the first diffusion region 120a and the second diffusion region 120b of each photodiode 120 have substantially the same doping profile. In some embodiments, the first diffusion region 120a and the second diffusion region 120b have substantially the same doping concentration. As such, each photodiode 120 may have equal dopant concentrations and substantially the same size and shape. It is appreciated that the full well capacity of photodiodes 120 is mostly set by the size and dopant concentrations of their doped first diffusion region 120a and the second diffusion regions 120b. Each photodiode 120 may have substantially the same full well capacity. It is known in the art that having both photodiodes have similar (if not equal) full well capacities allows for reduced complexity for signal processing.

In some embodiments, the diffusion region disposed closer to the illuminated surface may have higher doping concentration. For example, for a backside illuminated image sensor, the first diffusion region 120a that is closer to the backside surface (e.g., surface 112) may have higher doping concentration than the second diffusion region 120b. For another example, for a front-side illuminated image sensor, the second diffusion region 120b that is closer to the front side surface (e.g., surface 132) may have higher doping concentration than the first diffusion region 120a.

Each of the plurality of pixel isolation structures 140 is arranged in between two adjacent photodiodes 120 to electrically isolate neighboring photodiodes 120 preventing electrical crosstalk. Each of the plurality of pixel isolation structures 140 includes a first isolation structure 140a and a second isolation structure 140b. The first isolation structure 140a is formed in the first epitaxial layer 110 extending toward to the first side 102 of the semiconductor substrate 100. The second isolation structure 140b is formed in the second epitaxial layer 130 extending substantially through the second epitaxial layer 130.

The first isolation structures 140a of the plurality of pixel isolation structures 140 are arranged in between two adjacent first diffusion regions 120a and the second isolation structures 140b of the plurality of pixel isolation structures 140 are arranged between two adjacent second diffusion regions 120b. Each of the first isolation structures 140a of the plurality of pixel isolation structures 140 is configured to electrically isolate neighboring first diffusion regions 120a, and each of the second isolation structures 140b of the plurality of pixel isolation structures 140 is configured to electrically isolate neighboring second diffusion regions 120b.

Each of the first isolation structures 140a may be arranged to extend a depth greater than the implant depth of the first diffusion regions 120a. For example, the first isolation structures 140a may be extended through the first epitaxial layer 110 to the first side 102 of the semiconductor substrate 100, while the first diffusion region 120a may be arranged to extend a depth into the first epitaxial layer 110.

Each of the second isolation structures 140b is arranged to extend from the surface 132 of the second epitaxial layer 130 through the second epitaxial layer 130 to the first epitaxial layer 110 and coupled to each of the respective first isolation structures 140a. In some embodiments, the second isolation structure 140b may be electrically coupled to the second isolation structure 140a. In some embodiments, each of the second isolation structures 140b may be physically or structurally connect to each respective first isolation structure 140a.

In some embodiments, each of the first isolation structures 140a and each of the second isolation structures 140b may be formed by ion implantation. Each of the first isolation structures 140a and each of the second isolation structures 140b may be implant isolation regions doped with dopant having conductive type opposite to the first and second diffusion regions 120a, 120b. For example, each of the first diffusion regions 120a may be a first N-type diffusion region, each of the second diffusion region 120b may be a second N-type diffusion region, each of the first isolation structures 140a may be a first P-type implant isolation region, and each of the second isolation structures 140b may be a second P-type implant isolation region. The P-type implant isolation region and the second P-type implant isolation region may have substantially the same doping concentration.

In some embodiments, the lateral width of each of the first isolation structure 140a is less than the lateral width of each of the first diffusion region 120a. The lateral width of each of the second isolation structures 140b is less than the lateral width of each of the second diffusion regions 120b. In some embodiment, the lateral width of each of the first and second diffusion regions 120a, 120b is at least twice of the lateral width of each of the first and second isolation structures 140a, 140b.

In some embodiments, a plurality of deep trench isolation structures 150 is formed on the second side 104 of the semiconductor substrate 100. Each of deep trench isolation (B-DTI) structures 150 is formed on the backside surface (i.e., surface 112) of the semiconductor substrate 100 and extended a depth into the semiconductor substrate 100 toward the first side 102 of the semiconductor substrate 100. Each of deep trench isolation structures 150 may be referred as backside deep trench isolation (B-DTI) structures. Each of deep trench isolation structures 150 is arranged to extend into the first epitaxial layer 110. Each of deep trench isolation structures 150 may be arranged to extend into each respective first isolation structure 140a. Alternatively, a portion of each deep trench isolation structure 150 may be formed in each respective first isolation structure 140a, so as to provide full isolation between adjacent first diffusion regions 120a of the plurality of photodiodes 120 and prevent optical and electrical crosstalk between adjacent first diffusion regions 120a.

In one embodiment, each of the first isolations structure 140a is formed of first implant isolation region, and each of the second isolation structures 140b is formed of a second implant isolation region. Each of deep trench isolation structures 150 may be extended into each of the first implant isolation regions.

In some embodiments, the semiconductor substrate 100 may be pre-fabricated with the first epitaxial layer 110 formed thereon. The first diffusion regions 120a of the plurality of photodiodes 120 and the first isolation structures 140a of the plurality of pixel isolation structures 140 may be first formed in the first epitaxial layer 110. Then, the second epitaxial layer 130 may be formed on the first epitaxial layer 110 of the semiconductor substrate 100 by an epitaxial growth process. The second diffusion regions 120b of the plurality of photodiodes 120 and the second isolation structures 140b of the plurality of pixel isolation structures 140 may be subsequently formed in the second epitaxial layer 130.

In some embodiments, the plurality of deep trench isolation structures 150 may be formed after the formation of the second epitaxial layer 130, the second diffusion regions 120b, and the second isolation structures 140b by lithography and etching processes.

Although not illustrated, in some embodiments, each of the deep trench isolation structures 150 may be filled with a dielectric material, such as oxide material or a material with dielectric constant greater than 3.9 (referred as high k material), to provide electrical isolation between adjacent photodiodes 120. In some embodiments, each of the deep trench isolation structures 150 may be filled with a dielectric material having a refractive index lower than the refractive index of the semiconductor substrate 100, such as silicon oxide to further reduce optical crosstalk. Filling dielectric material into the plurality of deep trench isolation structures 150 by deposition process, such as chemical vapor deposition (CVD) are known in the art, thus details are omitted in order not to obscure the present disclosure. In some embodiments, a lining layer, such as oxide material, is deposited into each of the deep trench isolation structures 150, and each of the deep trench isolation structures 150 is subsequently filled with reflective material to enhance reflectively. The reflective material may include aluminum (Al), tungsten (W), the combination thereof, or other suitable material.

Figure 1B:
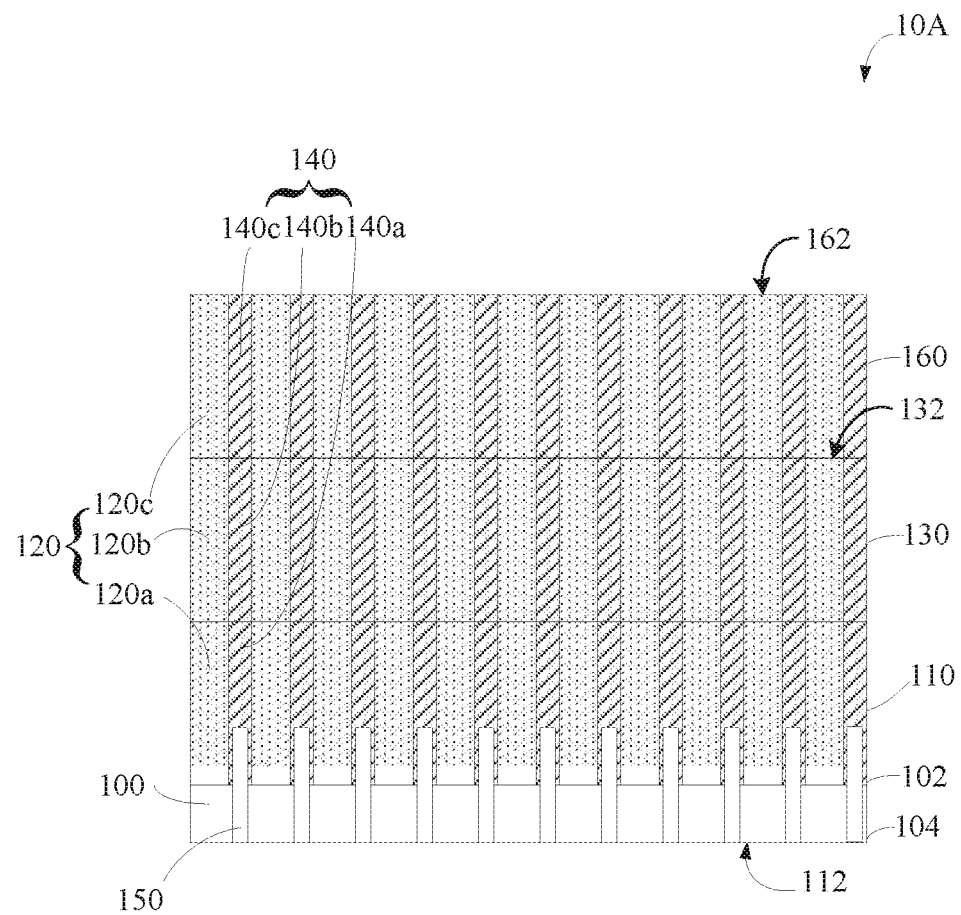
FIG. 1B illustrates a cross-sectional view of an exemplary image sensor structure in accordance with an embodiment of the present disclosure.

In some embodiments, to further increase the thickness of the photodiode 120, additional epitaxial layer may be grown on to the second epitaxial layer 130, wherein the additional epitaxial layer may have a plurality of third diffusion regions and a plurality of third isolation structures disposed therein, wherein the plurality of third isolation structures is arranged between the adjacent third diffusion regions. Please referred to FIG. 1B, which illustrates an example cross sectional view of an image sensor 10 provided in accordance to an exemplary embodiment of the present disclosure. It is appreciated that an image sensor 10A may share similarities with the image sensor 10 of FIG. 1A, and similarly named and numbered elements described above are coupled and function similarly below. The image sensor 10A further includes a third epitaxial layer 160 formed on the second epitaxial layer 130 by another epitaxial growth process (third epitaxial growth process), wherein the third epitaxy layer 160 may be doped with dopant of same conductive type as the first and second epitaxial layers 110, 130. Each of the plurality of photodiodes 120 may further include a third diffusion region 120c. Each of the plurality of pixel isolation structures 140 may further include a third isolation structure 140c. The third epitaxial layer 160 may have a surface 162 that may be referred as front side surface of the stacking structure of the third epitaxial layer 160, the second epitaxial layer 130, the first epitaxial layer 110, and the semiconductor substrate 100 in the image sensor 10A. The surface 112 may be referred as the backside surface of the stacking structure of the third epitaxial layer 160, the second epitaxial layer 130, the first epitaxial layer 110, and the semiconductor substrate 100 in the image sensor 10A substrate 100.

In some embodiments, the first epitaxial layer 110, the second epitaxial layer 130, and the third epitaxial layer 160 may have substantially the same doping concentration.

In some embodiments, the third epitaxial layer 160 has substantially the same thickness as the second epitaxial layer 130.

Each of the third diffusion regions 120c is formed in the third epitaxial layer 160 and each of the third diffusion regions 120c may form based on the position of the second diffusion region 120b. The third diffusion regions 120c may be formed of dopant having the same conductive types as the first and second diffusion regions 120a, 120b. Each of the third diffusion regions 120c may be arranged to extend from the surface 162 and substantially through the third epitaxial layer 160 the second diffusion region 120b to electrically couple to each respective second diffusion region 120b.

Each of the third isolation structures 140c is formed in the third epitaxial layer 160, and each of the plurality of third isolation structures 140c may be arranged to form between two adjacent third diffusion regions 120c to electrically isolate adjacent third diffusion regions 120c. Each of the plurality of third isolation structures 140c may be arranged to extend through the third epitaxial layer to couple to each of the plurality of second isolation structures 140b.

In some embodiments, each of the third isolation structures 140c may be formed by ion implantation with dopant having conductivity opposite to the third diffusion region 120c. For example, each of the third isolation structures 140c may be a third P-type implant isolation region and each of the third diffusion region 120c may be a third N-type diffusion region.

Each of the third diffusion regions 120c forms a third light sensing region for each respective photodiode 120'. Each photodiode 120' may operatively generate and accumulate image charges in response to the portion of incoming light each absorbed in at least one of the associated first diffusion region 120a, the second diffusion regions 120b, and the third diffusion region 120c during an integration or exposure period of the image sensor 10A. In other words, the combined accumulated image charges in the first diffusion region 120a, the second diffusion region 120b, and the third diffusion region 120c of a photodiode 120 may represent as the light sensing response for the respective photodiode 120' and outputted by that photodiode 120' during a charge transfer period of the image sensor 10A.

With two or more epitaxial layers stacking structure, the image sensor 10 or 10A may have deeper implanted photodiodes (e.g., photodiode 120) for IR sensing as well as deep isolation structure for reducing crosstalk between photodiodes overcoming the processing limitations imposed by current photolithography, implantation and etching processes. For example the implant depth or the thickness of photodiodes in the image sensor 10 or 10A may at least double, in comparison to an image sensor structure with single epitaxial layer using current photolithography, implantation and etching processes processing technology. The overall implant depth or thickness of each photodiode (e.g., photodiode 120, or 120') may depend upon the combination thickness of the first and the second epitaxial layers. As such, the light sensitivity of photodiodes to IR light may be improved without affecting light sensitivity to other visible light, such as blue light, green light and red light.

Referring back to FIG. 1A, in some embodiments, the image sensor 10 may include a pixel array with the plurality of pixels formed on the front side 102 of the semiconductor substrate 100. For some embodiments where the image sensor 10 is a BSI image sensor, the pixels/photodiodes in the pixel array is configured to receive light from the surface 112 (backside surface) of the semiconductor substrate 100. For some embodiments where the image sensor 10 is a FSI image sensor, the pixels/photodiodes in the pixel array is configured to receive light from the surface 132 (front side surface) of the second epitaxial layer 130. Each pixel includes at least a photodiode 120 and adjacent photodiodes 120 are isolated by the pixel isolation structure 140. In one embodiment, each pixel uses four transistors formed on front side 102 of the semiconductor substrate 100, which is known in the art as a 4T active pixel arrangement. However, one of ordinary skill in the art given the benefit of this disclosure can appreciate that pixel array of the present invention can be used with any type of pixel design, including but not limited to 3T, 5T, 6T, and other suitable designs.

In the depicted 4T pixel embodiment, each pixel includes at least a photodiode 120, which in one example may be a pinned photodiode. In other words, a pinning layer of first conductive type (e.g., P-type) may be disposed between the first diffusion region 120a and the backside surface (e.g., surface 112) or between the second diffusion region 120b and the front side surface (e.g., surface 132). However, the photodiode 120 may also be a, partially pinned photodiode, or unpinned photodiode. The photodiode 120 generates and accumulates image charges in response to incoming light, the photodiode 120 outputs an image data signal that is used to modulate an amplification transistor. The amplification transistor may also be referred to as a source follower transistor. A transfer transistor having a transfer gate is then used to transfer the image data signal outputted by the photodiode to a floating diffusion node and the gate of the amplification transistor.

In operation, during an integration period (also referred to as an exposure or accumulation period), each photodiodes 120 may generate and store image charges generated in response to incoming light in at least one of the first diffusion region 120a and the second diffusion region 120b of the respective photodiode 120. After the integration period, the transfer gate is turned on to operatively transfer the image charges corresponding to image data signal held in at least of the first diffusion region 120a and the second diffusion region 120b to the associated floating diffusion node. After the image data signal has been transferred to the floating diffusion node, the transfer gate is turned off again for the start of a subsequent integration period. The image data signal on the floating node is then used to modulate the amplification transistor, which is readout by peripheral circuitry. Peripheral circuitry may include amplifiers, filters, or other signal processing circuits. After readout, a reset transistor having a reset gate resets the floating node to a reference voltage. In one embodiment, the reference voltage is Vdd.

FIG. 2A-2G illustrates cross-sectional views in accordance to an exemplary fabrication method of an image sensor of FIG. 1 in accordance with teaching of the present disclosure. FIG. 3 shows a flow chart illustrating an exemplary method for fabricating an exemplary image sensor of FIG. 1 in accordance with teaching of the present disclosure. It is preferable to view FIG. 2A-2G in correspondence with FIG. 3.

In block 310, form a first epitaxial layer of a first conductive type on a semiconductor substrate. The semiconductor substrate has a first side (front side) and a second side (backside) opposite to the first side. The first epitaxial layer may be epitaxially grown on the first side of the semiconductor substrate by a first epitaxial growth.

Figure 2A:
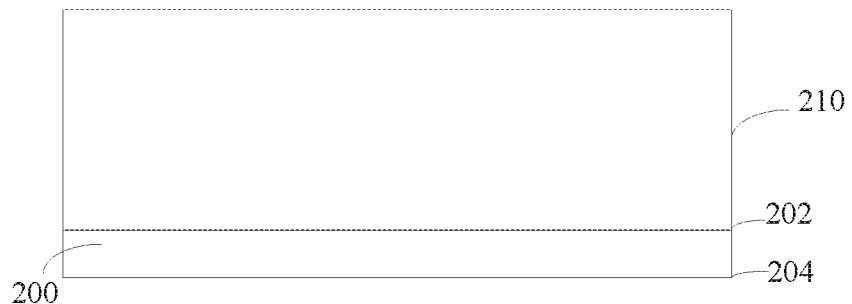
FIG. 2A-2G illustrates cross-sectional views in accordance to an exemplary fabrication method of an image sensor of FIG. 1A in accordance with teaching of the present disclosure.
Figure 3:
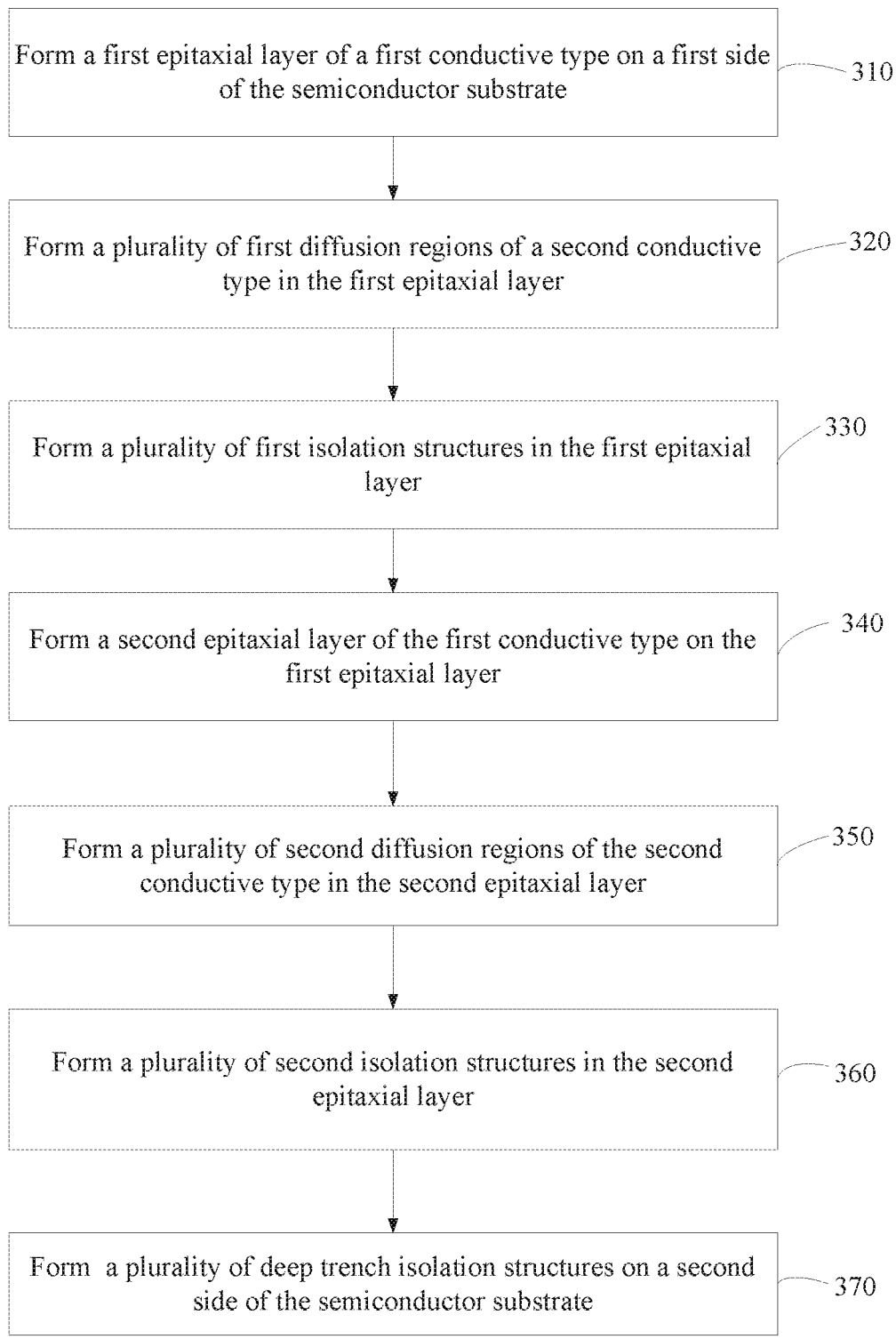
FIG. 3 shows a flow chart illustrating an exemplary method for fabricating an exemplary image sensor of FIG. 1 in accordance with with teaching of the present disclosure.

Referred to FIG. 2A, a semiconductor substrate 200 has a first side 202 and a second side 204 opposite to the first side 202. In some embodiments, the semiconductor substrate 200 may be a silicon semiconductor substrate, a doped silicon semiconductor substrate, such as a P-type doped silicon substrate or an N-type doped silicon substrate. A first epitaxial layer 210 is grown on the first side 202 of the semiconductor substrate 200 by a first epitaxial growth.

In some embodiments, the first epitaxial layer 210 may be formed, for example, of an epitaxially grown layer of a crystalline structure inherited from the semiconductor substrate as a base. This epitaxial growth is a well-known technology that subjects a silicon (Si) precursor gas to thermal decomposition in hydrogen ($H_2$) gas to form a thin silicon layer having a similar crystalline structure as prime wafers In some embodiments, the first epitaxial layer 210 may have thickness ranged from 2-3 um.

In some embodiments, the semiconductor substrate 200 and the first epitaxial layer 210 may be of same conductive type, for example, both the semiconductor substrate 200 and the first epitaxial layer 210 may be doped with P-type (first conductive type) dopant, such as boron. In some embodiments, the semiconductor substrate 200 and the first epitaxial layer 210 may be of opposite conductive type, for example, the semiconductor substrate 200 may be doped of N-type (second conductive type) dopant, such as arsenic or phosphorus, while and the first epitaxial layer 210 may be doped with P-type (first conductive type) dopant.

In block 320, a plurality of first diffusion regions is formed in the first epitaxial layer. The plurality of first diffusion regions may be formed by an ion implantation process that includes number of implantations at different implant energies such that each of first diffusion regions is implanted to a depth in the first epitaxial layer. Each of the plurality of first diffusion regions formed a first light sensing region of each respective photodiode.

Figure 2B:
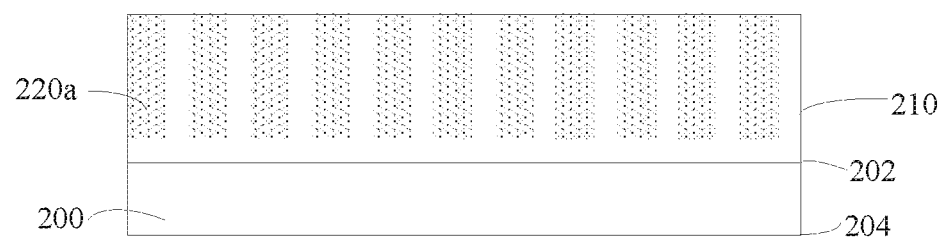

Referred to FIG. 2B, a plurality of first diffusion regions 220a of a plurality of photodiodes 220 may be formed in the first epitaxial layer 210 by a first ion implantation process, such that each of first diffusion regions 220a is implanted to a depth in the first epitaxial layer 210.

The plurality of first diffusion regions 220a is arranged to extend a first depth into the first epitaxial layer 210. In some embodiments, the first depth may range from 2-3 um. In some embodiments, the lateral width of each first diffusion regions 220a may range from 0.5 um to 3 um, depend on the pixel size of the pixels configured for the image sensor.

In some embodiments, a plurality of a first set of alignment markings may be formed on the first epitaxial layer 210 by a lithography process using photoresist (positive or negative). The plurality of first diffusion regions may then be formed in the first epitaxial layer 210 according the plurality of first set of alignment markings by the first ion implantation process that may include number of implantations at different implant energies.

The plurality of first diffusion regions 220a is formed of an opposite conductive type of the first epitaxial layer 210. For example, the plurality of first diffusion regions is formed of the second conductive type, such as N-type, and the first epitaxial layer is formed of the first conductive type, such as P-type. In some embodiments, the plurality of second diffusion regions 220b may also referred as the plurality of first N-type diffusion regions.

In block 330, a plurality of first isolation structures of a plurality of pixel isolation structures is formed on the first side of the semiconductor substrate. The plurality of first isolation structures is formed in the first epitaxial layer, and arranged to extend through the first epitaxial layer toward the first side of the semiconductor substrate. Each of the first isolation structures is arranged in between two adjacent first diffusion regions to electrically isolate two adjacent first diffusion regions. Each of the first isolation structures is arranged to extend a greater depth into the first epitaxial layer than the depth that each of the first diffusion region is extend into the first epitaxial layer.

Figure 2C:
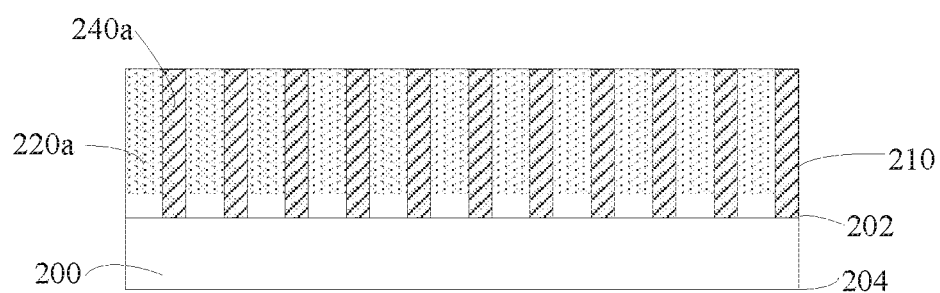

Referred to FIG. 2C, a plurality of first isolation structures 240a of a plurality of pixel isolations structures 240 may formed in the first epitaxial layer 210. Each of the first pixel isolation structures 240a is arranged between adjacent first diffusion regions 220a to electrically isolate two adjacent first diffusion 220a. Each of the first pixel isolation structures 240a may be formed to extend substantially through the first epitaxial layer 210 toward the first side 202 of the semiconductor substrate 200. In some embodiments, each of the first isolation structures 240a may be formed and in direct contact with nearby first diffusion regions 220a.

In some embodiments, the plurality of first isolation structures 240a may be a plurality of implant isolation regions doped with dopant having conductive type opposite to the plurality of first diffusion regions 220a. Each of the plurality of first isolation structures 240a may be formed by number implantations at different implantation energies by a second ion implantation process to form of a region having a substantially constant dopant concentration over most of the depth that each of the plurality of first isolation structures 240a is extended. For example, the plurality of first isolation structures 240a may be a first P-type implant isolation regions that may be formed by the second ion implantation process. In one embodiments, the first isolation structures 240a may be formed in the same ion implantation process as the first diffusion regions 220a.

In some embodiments, each of the first isolation structures 240a is arranged to extend a greater depth into the first epitaxial layer 210 than the depth that each of the first diffusion region 220a is extended into the first epitaxial layer 210.

In some embodiments, the plurality of first diffusion region 220a of the plurality of photodiodes 220 and the plurality of first isolation structures 240a of the plurality of pixel isolation structures 240 may be formed by masking and ion implantation in the first epitaxial layer 210.

In block 340, a second epitaxial layer of the first conductive type is formed on the first epitaxial layer. The second epitaxial layer may be epitaxially grown on the first epitaxial layer by a second epitaxial growth process. The second epitaxial layer may be epitaxially aligned with the first epitaxial layer. In some embodiments, the second epitaxial layer has the same conductive type as the first epitaxial layer.

Figure 2D:
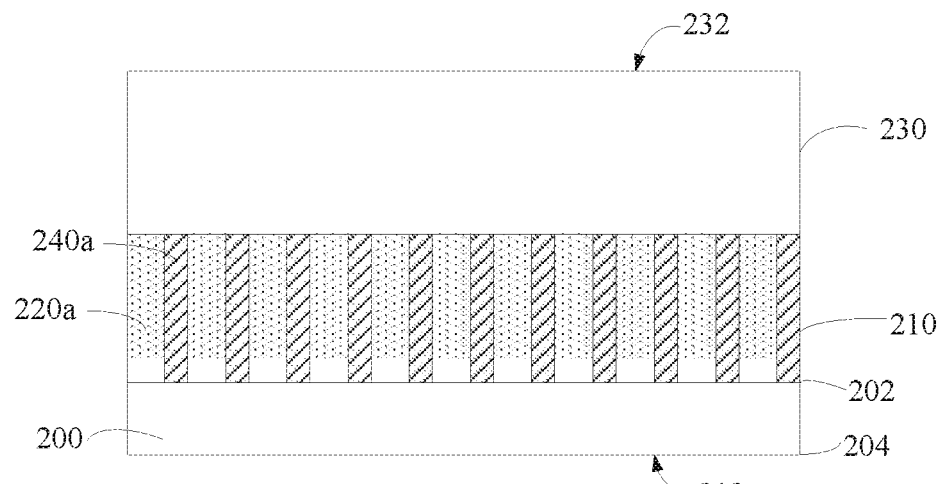

Referred to FIG. 2D, a second epitaxial layer 230 is formed on the first epitaxial layer 210. The second epitaxial layer 230 may have a surface 232 that may be referred as a front side surface of the stacking structure of the second epitaxial layer 230, the first epitaxial layer 210, and the semiconductor substrate 200.

The second epitaxial layer 230 may be epitaxially grown on the first epitaxial layer 210 with a thickness. The thickness of the second epitaxial layer 230 may range from 2-3 um. In some embodiments, the first epitaxial layer 210 and the second epitaxial layer 230 may have substantially the same thickness. In some embodiments, the first epitaxial layer 210 and the second epitaxial layer 230 may have different thickness. In one embodiments, the first epitaxial layer 210 may be thicker than the second epitaxial layer 230. In one embodiment, the second epitaxial layer 230 may be thicker than the first epitaxial layer 210.

In some embodiments, the second epitaxial layer 230 may be doped with dopant having same conductive types as the first epitaxial layer 210. In some embodiments, the second epitaxial layer 230 and the first epitaxial layer 210 may be doped with P-type (first conductive type) dopant. In some embodiments, the first epitaxial layer 210 and the second epitaxial layer 230 may have substantially the doping concentration.

In block 350, a plurality of second diffusion regions of the plurality of photodiodes is formed in the second epitaxial layer. Each of the plurality of second diffusion regions is configured to extend substantially through the second epitaxial layer and electrically coupled with each of the first diffusion regions. Each of the plurality of second diffusion regions formed as a second light sensing region of each respective photodiode. The plurality of second diffusion regions may be of same conductive type as the first diffusion regions. For example, the second diffusion regions may be of the second conductive type.

Figure 2E:
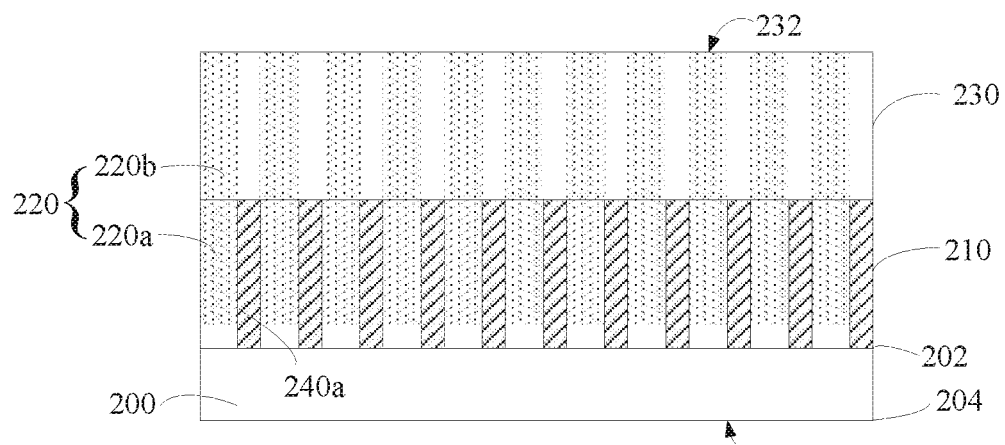

Referred to FIG. 2E, a plurality of second diffusion regions 220b of the plurality of photodiodes 220 may be formed in the second epitaxial layer 230. Each of the second diffusion regions 220b may be arranged to extend through the second epitaxial layer 230 and electrically coupled to each of the first diffusion regions 220a.

The plurality of second diffusion regions 220b may be formed in the second epitaxial layer 230 by a third ion implantation, such as implant with N-type (second conducive) dopants based on the positions of the plurality of first diffusion regions 220a. The plurality of second diffusion regions 220b may be implanted with a number of implantations at different implantation energies.

In some embodiments, each of the plurality of second diffusion regions 220b may substantially aligned with each of the first diffusion regions. In some embodiments, the misalignment between each second diffusion region formed in the second epitaxial layer 230 and each corresponding first diffusion region 220a formed in the first epitaxial layer 210 may be 0.05 um or less.

In some embodiments, each of the second diffusion regions 220b is extended to be in contact with each of the first diffusion regions 220a, such that each of the first diffusion regions 220a and each of the corresponding first diffusion regions 220a form a continuous region, and the image charges generated by each of the plurality of photodiodes 220 in response to incoming light, for example directed from the second side 204 of the semiconductor substrate 200 are accumulated in at least one of the first diffusion region 220a and the second diffusion regions 220b, thereby enhanced the light sensitivity of the photodiodes 220.

The implant depth or the thickness of each second diffusion region 220b may be the same as the thickness of the second epitaxial layer 230. In some embodiments, the thickness of each second diffusion region 230 may range from 2-3 um. In some embodiments, the lateral width of each first diffusion regions 220a may range from 0.5 um to 3 um, depend on the pixel size of the pixels in the image sensor. In some embodiment, the width of each of the plurality of second diffusion regions is the same as the connected first diffusion regions. In some embodiments, the plurality of second diffusion regions 220b may also referred as the plurality of second N-type diffusion regions. In some embodiments, each of the plurality of second diffusion regions 220b may have substantially the same doping profile as each of the plurality of first diffusion regions 220a.

In block 360, a plurality of second isolation structures of the pixel isolation structure is formed in the second epitaxial layer. Each of the plurality of second isolation structures is arranged between adjacent second diffusion regions to electrically isolate neighboring second diffusion regions. Each of the plurality of second isolation structure is extended through the second epitaxial layer to connect to each of the first isolation structures in the first epitaxial layer.

Figure 2F:
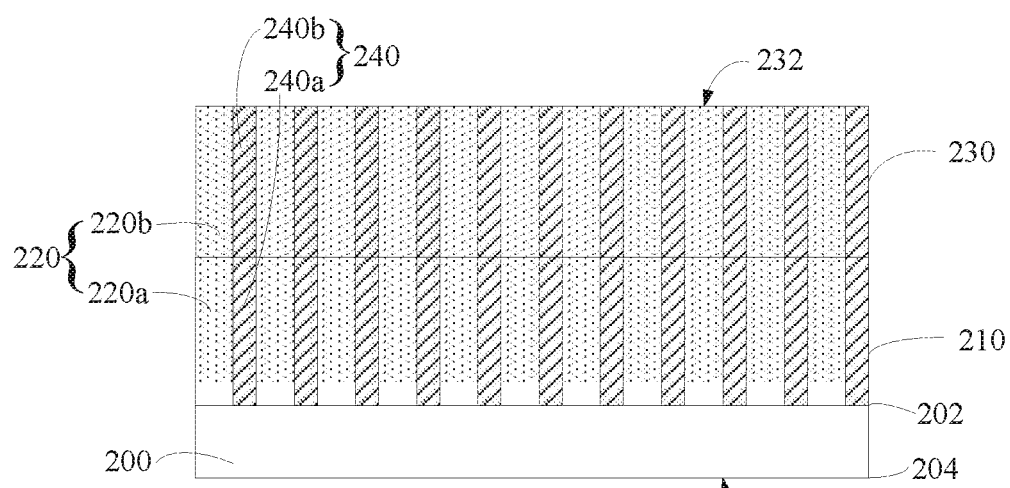

Referred to FIG. 2F, a plurality of second isolation structures 240b of the pixel isolation structures 240 is formed in the second epitaxial layer 230 based on the positions of the first isolation structures 240a. Each of the plurality of second isolation structures 240b may be substantially aligned with each corresponding first isolations structure 240a. As illustrated, each of the plurality of second isolation structures 240b may be extended from the surface 232 of the second epitaxial layer 230 through the second epitaxial layer 230 and connect with each of the respective first isolation structures 240a formed in the first epitaxial layer 210. The plurality of second isolation structures 240b is arranged in between adjacent second diffusion regions 220b to electrically isolate two adjacent second diffusions 220b. In some embodiments, each of the plurality of second isolation structures 240b may be extended through the second epitaxial layer 230 and arranged to be in contact with each corresponding first isolation structure 240a.

In some embodiments, each of the plurality of second isolation structures 240b may be formed by number implantations at different implantation energies and which results in the forming of a region having a substantially constant dopant concentration over most of the depth that each of the plurality of second isolation structures 240b is extended in a fourth ion implantation process. For example, the plurality of second isolation structures 240b may be a second P-type implant isolation regions that may be formed by the fourth ion implantation process. In one embodiments, the second isolation structures 240b may be formed in the same ion implantation process as the second diffusion regions 220b.

In some embodiments, the lateral width of each of the first and the isolation structures 240a, 240b may range from 0.1 um-0.3 um, depend on the pixel size of the pixels configured for the image sensor.

In some embodiments, the plurality of second diffusion region 220b of the plurality of photodiodes 220 and the plurality of second isolation structures 240b of the plurality of pixel isolation structures 240 may be formed by masking and ion implantation in the second epitaxial layer 230.

In block 370, in some embodiments, a plurality of deep trench isolation structures is formed on the second side of the semiconductor substrate. Each of the deep trench isolation structures is extended from the second side of the semiconductor substrate toward the first epitaxial layer. In some embodiments, each of the deep trench isolation structures may be extended from the second side of the semiconductor substrate a depth into the first epitaxial layer and in contact with each of the first isolation structures.

Figure 2G:
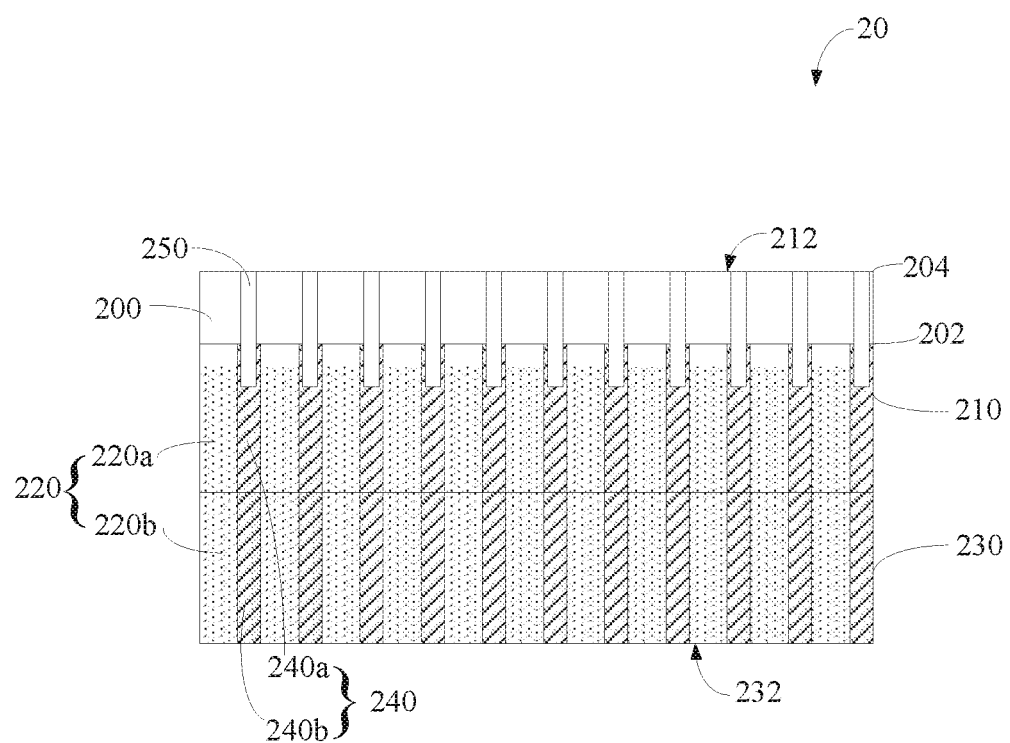

Referred to FIG. 2G, a plurality of deep trench isolation structures 250 is formed on the second side 204 of the semiconductor substrate 200. Each of the deep isolation structures 250 may be referred to as backside deep trench isolation (B-DTI) structures. Each of the deep trench isolation structures 250 may be formed between the two adjacent first diffusion regions 220a. Each of the deep trench isolation structures 250 may be extended from the second side 204 of the semiconductor substrate 200 into the first epitaxial layer 210 and in contact with each corresponding first isolation structures 240a.

In some embodiments, each of the plurality of deep isolations structures 250 may be formed by patterning and etching a plurality of vertical trenches on the second side 204 of the semiconductor substrate 200 and then depositing a dielectric material (such as oxide material) filling the plurality of vertical trenches by deposition process, such as chemical vapor deposition (CVD), atomic layer deposition (ALD), or physical vapor deposition (PVD).

In some embodiments, a lining layer is first deposited into the vertical trench of each deep trench isolation structures 250 by a first deposition process. Each of the deep trench isolation structures 150 is subsequently filled with reflective material in a second deposition process. The lining layer may include dielectric material, such as silicon oxide $SiO_2$, hafnium oxide ($HfO_2$), silicon nitride ($Si_3N_4$), tantalum oxide ($Ta_2O_5$), titanium oxide ($TiO_2$), zirconium oxide ($ZrO_2$), aluminum oxide ($Al_2O_3$), or the like. The reflective material may include aluminum (Al), tungsten (W), the combination thereof, or other suitable material.

In some embodiments, each of the deep trench isolation structures 250 is arranged to extend into each respective first isolation structure 240a. For example, each of the first isolation structures 240a may be a first P-type implant isolation region, and each of the deep isolation structures 250 may be arranged to extend into each respective first P-type implant region.

In some embodiments, the lateral width of each deep isolation structures 250 range from 0.1 um to 0.2 um.

The first isolation structures 240a, the second isolation structures 240b and the plurality of deep trench isolation structures 250 separate and isolate the adjacent photodiodes 220.

Optionally, the second side 204 of the semiconductor substrate 200 may be thinned before the formation of the plurality of deep trench isolation structures by a thinning process.

Figure 4A:
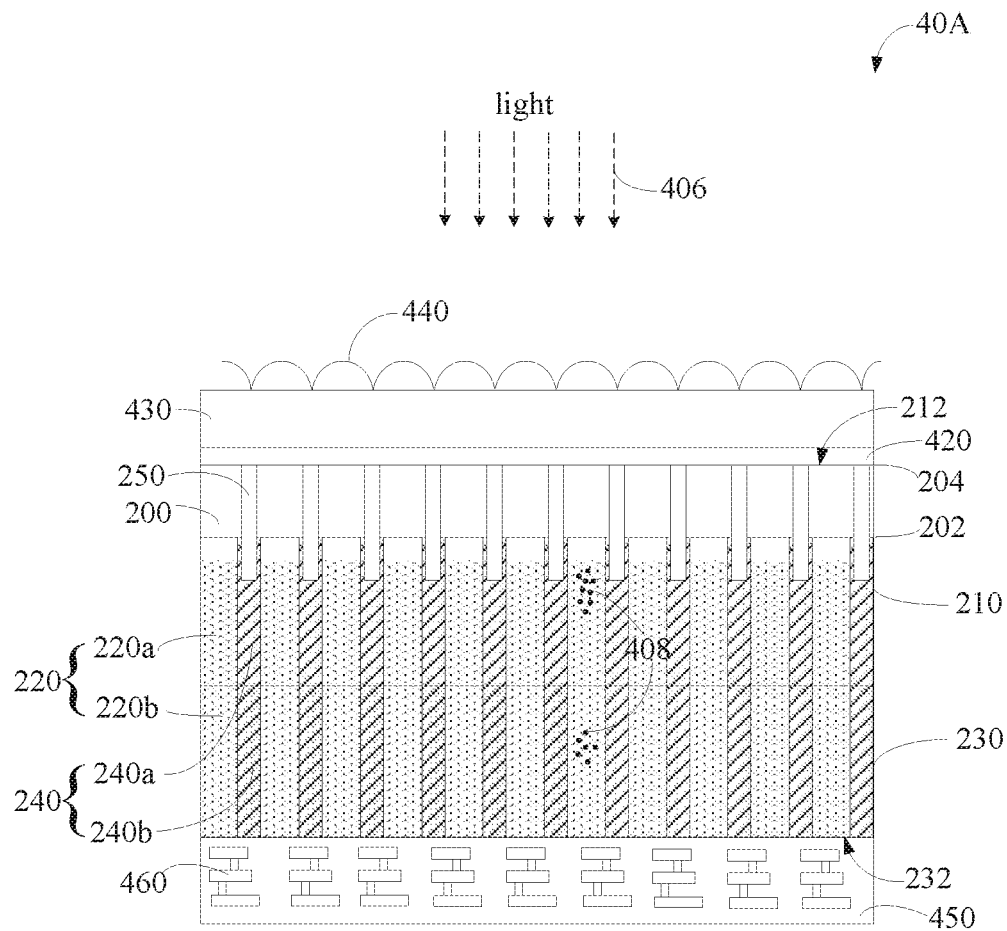
FIG. 4A illustrates a cross-sectional view of an exemplary backside illuminated image sensor structure in accordance with an embodiment of the present disclosure.

FIG. 4A illustrates a cross-sectional view of an exemplary image sensor in accordance with an embodiment of the present disclosure. It is appreciated that an exemplary image sensor 40A may share similarities with the image sensor 20 of FIG. 2G, and similarly named and numbered elements described above are coupled and function similarly below. FIG. 4A illustrates the image sensor 40A that may be fabricated using the method illustrated in FIG. 3. The illustrated image sensor 40A is a backside illuminated image sensor.

The difference between the image sensor 40A and the image sensor 20 of FIG. 2G is that the image sensor 40A further includes a buffer layer 420, a color filter layer 430, an array of micro-lenses 440, and at least an interlayer dielectric layer 450.

The buffer layer 420 is formed on the second side 204 (e.g., backside) of the semiconductor substrate 200 for relieving stress (such as tensile stress, or compressive stress) of the semiconductor substrate 200. In some embodiment, the buffer layer 420 may be formed from depositing dielectric material, such as silicon oxide ($SiO_2$), silicon nitride (SiN), silicon carbide (SiC), silicon carbon nitride (SiCN) and other suitable dielectric material by a deposition process, such as chemical vapor deposition (CVD), atomic layer deposition (ALD), or physical vapor deposition (PVD). In some embodiment, the buffer layer 420 may be formed from depositing dielectrically material having a dielectric constant greater than 3.9, such as hafnium oxide ($HfO_2$), titanium dioxide ($TiO_2$), aluminum oxide ($Al_2O_3$).

In some embodiments, the buffer layer 420 may be deposited on the second side 204 of the semiconductor substrate 200 after the formation of the deep trench isolation structures 250.

The color filter layer 430 is formed on the buffer layer 420. The color filter layer 430 may include a plurality of color filters (not illustrated) arranged in an array form. Each color filter may be disposed above each photodiode 220 and may be optically aligned with each respective photodiode 220. In other words, each color filter may be disposed on the backside of the semiconductor substrate 200 above the first diffusion regions 220a and the second diffusion regions 220b of the respective photodiodes 220. The color filters may be arranged according to a specific color filter pattern, such as a Bayer pattern or mosaic of red, green, blue, and IR additive filters (e.g., RGB, RGBG, GRGB, RGIRG, or BGIR G), a color filter pattern of cyan, magenta, yellow, and key (black) subtractive filters (e.g., CMYK), a combination of both, or otherwise. The array of micro-lenses 440 includes a plurality of micro-lenses, which may be formed on the color filter layer 430 to direct incoming light to the respective photodiodes 220.

The interlayer dielectric layer 450 is formed on the second epitaxial layer 230 specifically, the interlayer dielectric layer 450 is formed on the surface 232 of the second epitaxial layer 230 for encapsulating pixel transistor circuitry and multi-layer metallic interconnection structures 460 as well as providing isolation between different layers of the metallic interconnection structures 460. The interlayer dielectric layer 450 may be formed from dielectric material such as oxide or nitride material. The multi-layer metallic interconnection structures 460 may be formed from aluminum (Al), copper (C), or the combination thereof. The structure and formation of pixel transistor circuitry and multi-layer metallic interconnection structures 460 are known by one skilled in the art, and details are omitted herein in order not to obscure the understanding of this description.

In operation, the plurality of micro-lenses 440 operable to direct incoming light 406 to each respective photodiode 220. Each of the photodiode 220 operatively generates one or more image charges 408 in response to incoming light 406 and accumulated image charges 408 in at least one of the first diffusion reign 220a and the second diffusion region 220b depend upon the wavelength of light absorbed. In other words, each of the photodiode 220 may store the image charges 408 in the first diffusion reign 220a or the second diffusion region 220b depend upon the absorption depth of the portion of incoming light each received.

For example, incoming light 406 of shorter wavelength (such as blue light) that enters from the second side 204 of the semiconductor substrate 200 may be mostly absorbed by the first diffusion regions 220a of the respective photodiodes 220 and image charges generated may be stored in the first diffusion regions 220a. For another example, incoming light 406 of longer wavelength (such as red light, near IR light or IR light) that enters from the second side 204 of the semiconductor substrate 200 may be mostly absorbed by the second diffusion regions 220b of the respective photodiodes 220 and image charges generated may be stored in the second diffusion regions 220b. The light sensitivity of the image sensor 40A to near infrared light or infrared light may be enhanced without affecting the light sensitivity of the image sensor 40A to visible light wavelength.

Figure 4B:
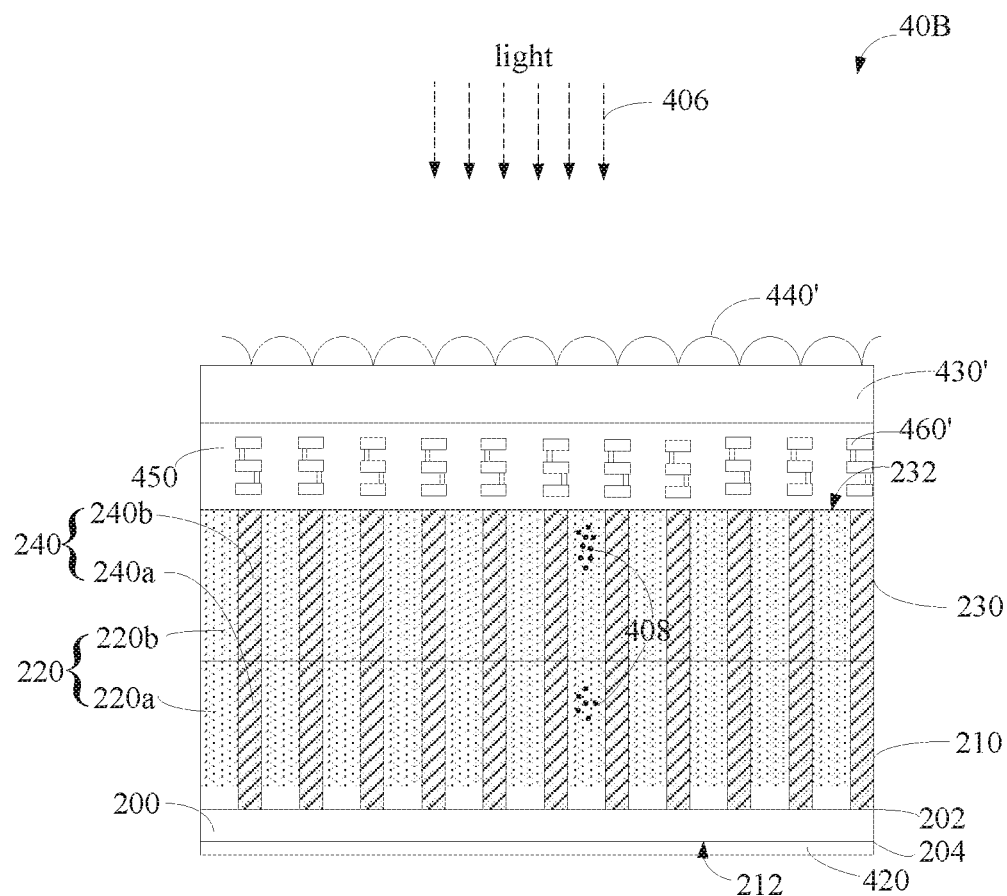
FIG. 4B illustrates a cross-sectional view of an exemplary front-side illuminated image sensor structure in accordance with an embodiment of the present disclosure.

Referred to FIG. 4B, which illustrates a cross-sectional view of an exemplary front-side illuminated image sensor structure in accordance with an embodiment of the present disclosure. It is appreciated that an exemplary image sensor 40B may share similarities with the image sensor 40A of FIG. 4B, and similarly named and numbered elements described above are coupled and function similarly below. The difference between the image sensor 40B and the image sensor 40A of FIG. 4B is that the image sensor 40B has an interlayer dielectric layer 460', a color filter layer 430' and an array of micro-lenses 440' formed on the second epitaxial layer 230.

In some embodiments, process for forming front-side illuminated image sensor may not include backside trench formation process. As illustrated in FIG. 4B, no deep trench isolation structures is formed on the second side 204 of the semiconductor substrate 200. Each of the photodiodes 220 are isolated from neighboring photodiodes 220 by pixel isolation structures 240. In other word, each of the photodiodes 220 are separated from neighboring photodiodes 220 by the corresponding first isolation structure 240a and the second isolation structure 240b arranged therebetween.

The interlayer dielectric layer 450' is formed on the second epitaxial layer 230 and the interlayer dielectric layer 450' may include multi-layer interconnection structures 460' arranged to be formed above the pixel isolation structures 240 for routing signals, such as, image data signal and control signals for the image sensor 40B. The color filter layer 430' is formed on the interlayer dielectric layer 450, and the color filter layer 430' include a plurality of color filters formed above each of the photodiodes 220. The color filters may be arranged in a specific color filter pattern, such as a Bayer pattern or mosaic of red, green, blue, and IR additive filters (e.g., RGB, RGBG, GRGB, RGIRG, or BGIR G). The array of micro-lenses included a plurality of micro-lenses 440', and each micro-lens 440' is arranged above each of the photodiodes 220 for directing incoming light 406 to each respective photodiode 220, i.e., directing incoming light 406 to the first and second diffusion regions 220a, 220b of each respective photodiode 220.

In operation, each of the photodiode 220 may operatively generate one or more image charges 408 in response to incoming light 406 received through the surface 232 (front side surface) of the second epitaxial layer 230 and accumulates charges 408 in at least one of the first diffusion reign 220a and the second diffusion region 220b depend upon light absorption depth of the incoming light 406.

In some embodiments, the first isolation structure 240a of each pixel isolation structures 240 may include a first front-side deep trench isolation structure and the second isolation structure 240b of each pixel isolation structure 240 may include a second front-side deep trench isolation structure. Referred to FIG. 5, which illustrates a cross-sectional view of an exemplary image sensor 50 in accordance with some embodiment of the present disclosure. It is appreciated that an image sensor 50 may share similarities with the image sensor 40A of FIG. 4A, and similarly named and numbered elements described above are coupled and function similarly below. The illustrated image sensor 50 is a backside illuminated image sensor.

The image sensor 50 may include a semiconductor substrate 500, a first epitaxial layer 510, a second epitaxial layer 530, a plurality of photodiodes 520, and a plurality of pixel isolation structures 540 arranged to form between adjacent photodiodes 520.

The semiconductor substrate 500 has a first side 502 (front side) and a second side 504 (backside) opposite to the first side 502. The first epitaxial layer 510 and the second epitaxial layer 530 may be sequentially grown on the first side 502 of the semiconductor substrate 500. In some embodiments, the epitaxially grown thickness of the first epitaxial layer 510 may be substantially the same as the second epitaxial layer 530. In some embodiments, the epitaxially grown thickness of the first epitaxial layer 510 may be different from the second epitaxial layer 530.

The second epitaxial layer 530 has a surface 532 that may be referred as the front side surface of the stacking substrate structure of the second epitaxial layer 530, the first epitaxial layer 510, and the semiconductor substrate 500. The semiconductor substrate 500 has a surface 512 that may be referred as the backside surface of the stacking substrate structure of the second epitaxial layer 530, the first epitaxial layer 510, and the semiconductor substrate 500.

A first light sensing region of the plurality of photodiodes 520 may be formed in first epitaxial layer 510 and a second light sensing region of the plurality of photodiodes 520 may be formed in second epitaxial layer 530. Specifically, each of the photodiodes 520 includes a first diffusion region 520a formed in the first epitaxial layer 510 and a second diffusion region 520b formed in the second epitaxial layer 530. Each of the second diffusion region 520b of each photodiode 520 is extended through the second epitaxial layer 530 and electrically couple to each respective first diffusion region 520a. In some embodiments, the second diffusion regions 520b of each photodiode 520 may be in contact with each of the first diffusion region 520a.

In some embodiments, the lateral width of the first diffusion region 520a may be the same as the lateral width of the second diffusion region 520b. In some embodiments, the implant depth (or the thickness) of the first diffusion region 520a in the first epitaxial layer 510 is the same as the implant depth (or the thickness) of the second diffusion region 520b in the first epitaxial layer 530.

In operation, each photodiode 520 operatively generates and accumulate image charges in response to incoming light 506 received through the surface 512 (backside surface). Each photodiode 520 may store the accumulated image charges in at least one of the first diffusion region 520a and the second diffusion region 520b, depend upon the wavelength of light absorbed, i.e., the absorption depth of the portion of incoming light each photodiode 520 received.

The first epitaxial layer 510 and the second epitaxial layer 530 may be formed of a first conductive type, for example, both are doped with P-type dopants, such as boron. The first diffusion regions 520a and the second diffusion regions 520b may be formed of second conductive type opposite to the first conductive type, for example, both are formed of N-type dopants, such as arsenic or phosphorous.

Each of the plurality of pixel isolations structures 540 may include a first front-side deep trench isolation (F-DTI) structure 540a and a second front-side deep trench isolation (F-DTI) structure 540b. The first F-DTI structure 540a of each pixel isolations structure 540 is disposed in the first epitaxial layer 510 and arranged to form between adjacent first diffusion regions 520a of the adjacent photodiodes 520 to electrically isolate between adjacent first diffusion regions 520a. The second F-DTI structure 540b of each pixel isolations structure 540 is disposed in the second epitaxial layer 530 and arranged to form between adjacent second diffusion regions 510 to electrically isolate adjacent second diffusion regions 520b.

In some embodiments, the lateral width of each of the first diffusion region 520a is greater than the lateral width of each of first F-DTI structure 540a. In some embodiments, the lateral width of each of the second diffusion region 520b is greater than the lateral width of each of second F-DTI structure 540b.

In some embodiments, the lateral width of each of first diffusion region 540a and the lateral width of each of second diffusion region 540b may range from 0.5 um to 3 um. The lateral width of each of first F-DTI structure 540a and the lateral width of each of second F-DTI structure 540b may range from 0.1 um to 0.2 um.

The first F-DTI structure 540a of each pixel isolations structure 540 may be formed by patterning and etching through the first epitaxial layer 510. The second F-DTI structure 540b of each pixel isolations structure 540 may be formed by patterning and etching through the second epitaxial layer 530.

The first F-DTI structure 540a of each pixel isolations structure 540 is extended from the surface of the first epitaxial layer 510 toward the second side 504 of the semiconductor substrate 500. In some embodiments, the first F-DTI structure 540a of each pixel isolations structure 540 is extended from the surface of the first epitaxial layer 510 to the surface 512 of the semiconductor substrate 500. The second F-DTI structure 540b of each pixel isolations structure 540 may be configured to substantially align with the respective first F-DTI structures 540a of the pixel isolations structure 540. The second F-DTI structure 540b may be configured to extend from the surface 532 of the second epitaxial layer 530 through the second epitaxial layer 530 and physically (or structurally) connect with the respective first F-DTI structure 540a. With such arrangement, the pixel isolation structures 540 may electrically isolate the plurality of photodiodes.

Although not illustrated, in some embodiments, each of the first F-DTI structures 540a and each of the second F-DTI structures 540b may be filled with dielectric material having refraction index lower than the semiconductor material (e.g., the first and second epitaxial layers 510, 520), such as silicon oxide. In some embodiments, each of the first F-DTI structures 540a and each of the second F-DTI structures 540b may have dielectric material having a dielectric constant greater than 3.9 or high k material deposited therein, such as aluminum oxide ($Al_2O_3$), hafnium oxide ($HfO_2$), tantalum pentoxide ($Ta_2O_5$), zirconium dioxide($ZrO_2$) or the combination thereof. In some embodiments, the dielectric material filling in each of the first F-DTI structures 540a may be different from the dielectric material filling in each of the second F-DTI structures 540b. In some embodiments, each of the first F-DTI structures 540a and each of the second F-DTI structures 540b may be filled with conductive material, such as metal, poly-silicon.

Figure 5:
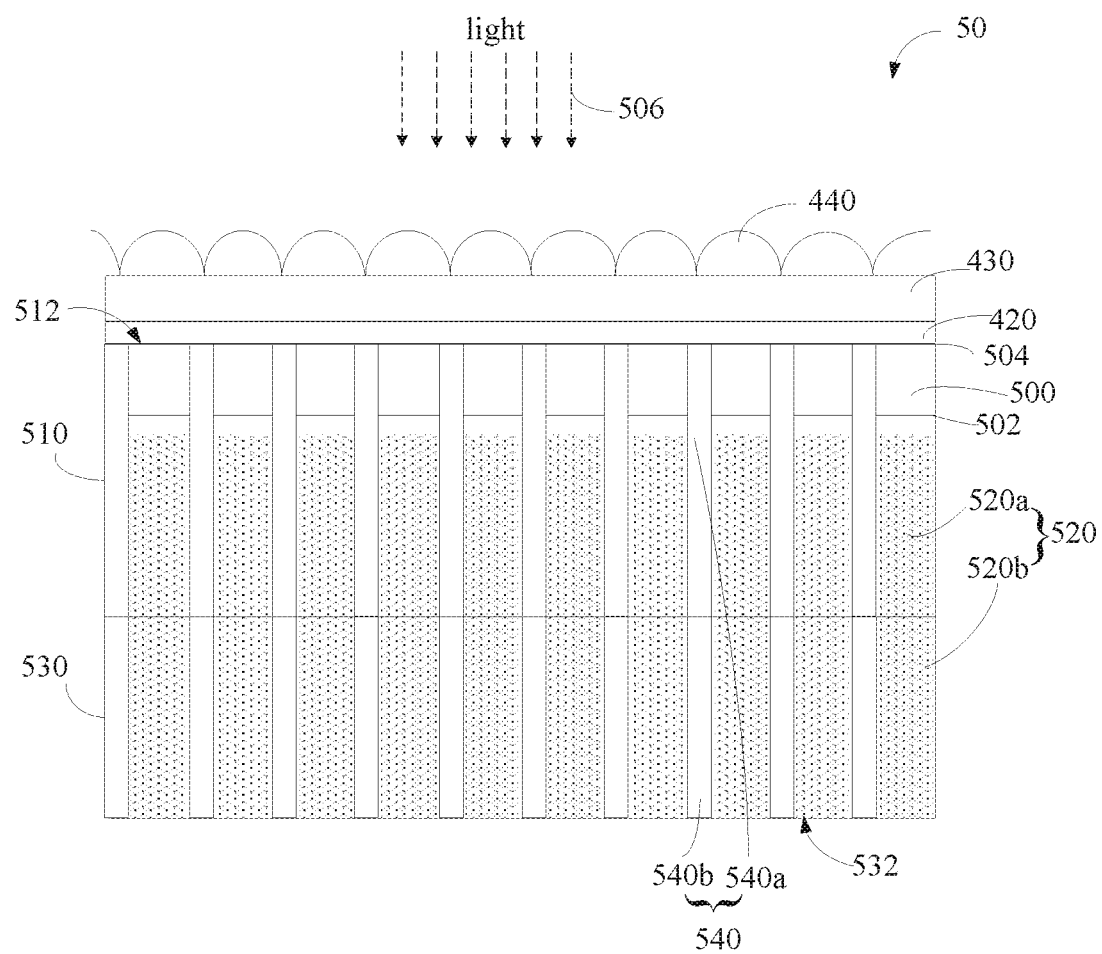
FIG. 5 illustrates a cross-sectional view of an exemplary backside image sensor structure in accordance with an embodiment of the present disclosure.

FIG. 6A-6F illustrates cross-sectional views in accordance to an exemplary fabrication method of an image sensor 50 of FIG. 5 in accordance with teaching of the present disclosure. FIG. 7 shows a flow chart illustrating an exemplary method for fabricating an exemplary image sensor 50 of FIG. 5 in accordance with teaching of the present disclosure. It is preferable to view FIG. 6A-6F in correspondence with FIG. 7.

In block 710, a first epitaxial layer is formed on a semiconductor substrate. The semiconductor substrate has a first side and a second side opposite to the first side. The first epitaxial layer may be epitaxially grown on the first side of the semiconductor substrate by a first epitaxial growth process.

Figure 6A:
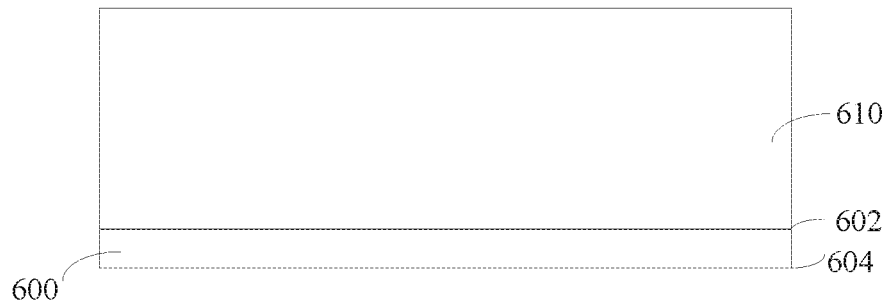
FIG. 6A-6F illustrates cross-sectional views in accordance to another exemplary fabrication method of the exemplary image sensor structure of FIG. 5 in accordance with teaching of the present disclosure.
Figure 7:
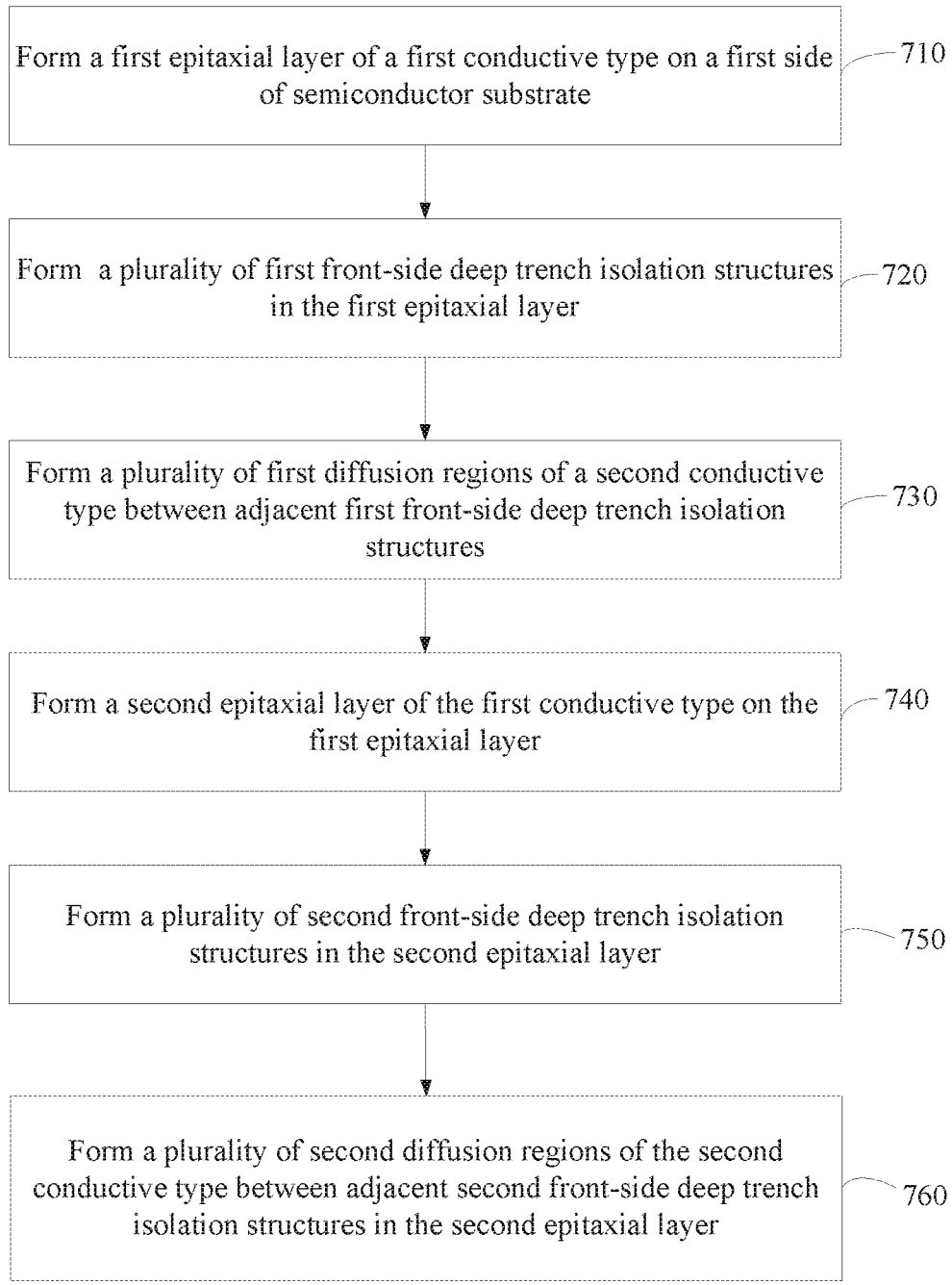
FIG. 7 shows a flow chart illustrating an exemplary method for fabricating an exemplary image sensor structure of FIG. 5 in accordance with teaching of the present disclosure.

Referred to FIG. 6A, a first epitaxial layer 610 is grown on a first side 602 of the semiconductor substrate 600 by a first epitaxial growth process. In some embodiments, the first epitaxial layer 610 may have thickness ranging from 2-3 um.

The semiconductor substrate 600 may be a silicon semiconductor substrate, a doped silicon semiconductor substrate, such as a P-type doped silicon substrate or an N-type doped silicon substrate. In some embodiments, the semiconductor substrate 600 may be of a first conductive type, and the first epitaxial layer 610 may be also of the first conductive type (e.g., P-type). In some embodiments, the semiconductor substrate 600 may be of a second conductive type (e.g., an N-type) and the first epitaxial layer 610 may be of the first conductive type.

In block 720, a plurality of first front-side deep trench isolation (F-DTI) structures of plurality of pixel isolation structures is formed in the first epitaxial layer.

Figure 6B:
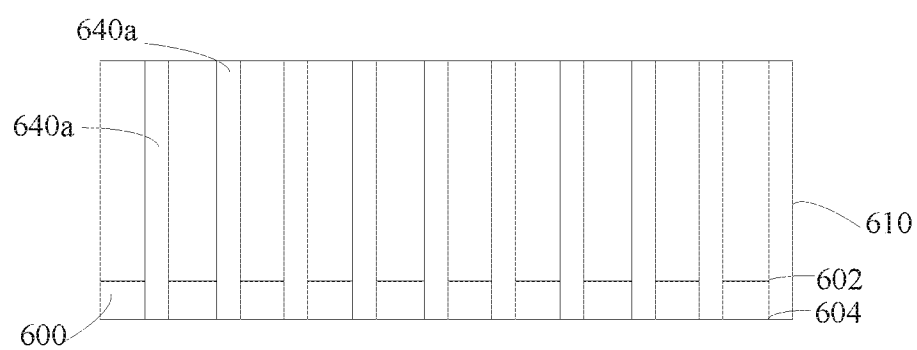

Referred to FIG. 6B, a plurality of first front-side deep trench isolation (F-DTI) structures 640a of a plurality of pixel isolation structures 640 is formed in the first epitaxial layer 610. The plurality of first F-DTI structures may be extended through the first epitaxial layer 610 to the second side 604 of the semiconductor substrate 600.

For example, the plurality of first F-DTI structures 640a may be formed by patterning with photoresist material (positive or negative material) onto the first epitaxial layer 610 and follow by a first etching process e.g., dry or wet etch processing, etching through the first epitaxial layer 610 and the semiconductor substrate 600.

In some embodiments, the plurality of first F-DTI structures 640a may be formed by patterning the first epitaxial layer and etching a plurality of deep trench structures from the first epitaxial layer 610 toward the second side 604 of the semiconductor substrate 600. Then, deposit a first dielectric material, such silicon oxide or high k material, such as aluminum oxide ($Al_2O_3$), hafnium oxide($HfO_2$), tantalum pentoxide ($Ta_2O_5$), zirconium dioxide($ZrO_2$) or the combination thereof, into the etched deep trench structures by a deposition process, such as chemical vapor deposition (CVD), atomic layer deposition (ALD), or physical vapor deposition (PVD).

In some embodiments, the plurality of first F-DTI structures 640a may be formed by patterning the first epitaxial layer 610 and etching a plurality of deep trench structures from the first epitaxial layer 610 toward the second side 604 of the semiconductor substrate 600. Subsequently, deposit a first dielectric material as lining layer and then filled with conductive material, such as metal.

In block 730, a plurality of first diffusion regions of a plurality of photodiodes are formed in the first epitaxial layer based on the position of the plurality of first front-side deep trench isolation structures. Each of the first diffusion regions is formed in the space between two adjacent first front-side deep trench isolation structures. Alternatively stated, each of first front-side deep trench isolation structure is formed between adjacent first diffusion regions. The plurality of first diffusion region may be formed by masking and implanting dopants of a second conductive type onto the first epitaxial layer, wherein the second conductive type is opposite to the first conductive type.

Figure 6C:
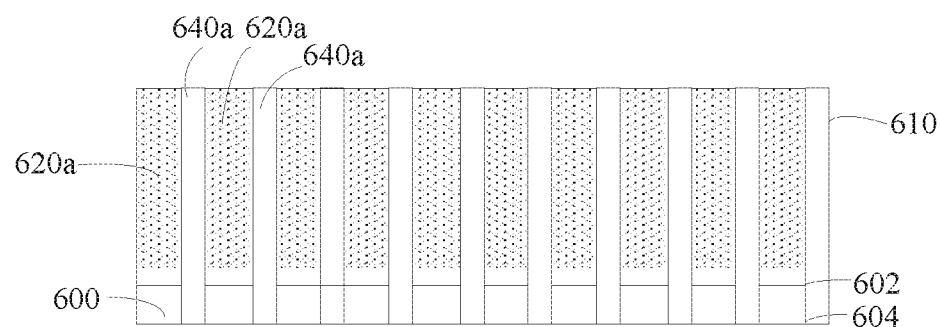

Referred to FIG. 6C, a plurality of first diffusion regions 620a is formed on in the first epitaxial layer 610 by a first ion implantation process. Each of the first diffusion regions 620a is formed to extend a depth into the first epitaxial layer 610. The plurality of first diffusion regions 620a may be formed of by implanting dopants of the second conductive type (e.g., N-type into the first epitaxial layer according to the positions of first F-DTI structures 640a. The plurality of first diffusion regions 620a may be implanted with a number of implantations at different implantation energies. In some embodiments, each of the plurality of first diffusion regions 620a is a first N-type diffusion region and the first epitaxial layer 610 is a first P-type epitaxial layer.

Each of the first diffusion regions 620a is arranged in between the first F-DTI structures 640a such that each of the first F-DTI structures 640a electrically isolates the adjacent first diffusion regions 620a of the photodiode 620. The extended depth of each first diffusion regions 620a in the first epitaxial layer 610 may be less than the extended depth of the first F-DTI structures 640a. Each of plurality of the second diffusion regions 620b may be referred as a first light sensing region of each respective photodiode 620. In some embodiments, the depth (or the thickness) of each first diffusion regions 620a ranges from 2-3 um.

In block 740, a second epitaxial layer is formed on the first epitaxial layer, and the second epitaxial layer may be substantially aligned with the first epitaxial layer. The second epitaxial layer is formed of same conductive type as the first epitaxial layer, for example the second epitaxial layer may be an epitaxial layer that is doped with the first conductivity type.

Figure 6D:
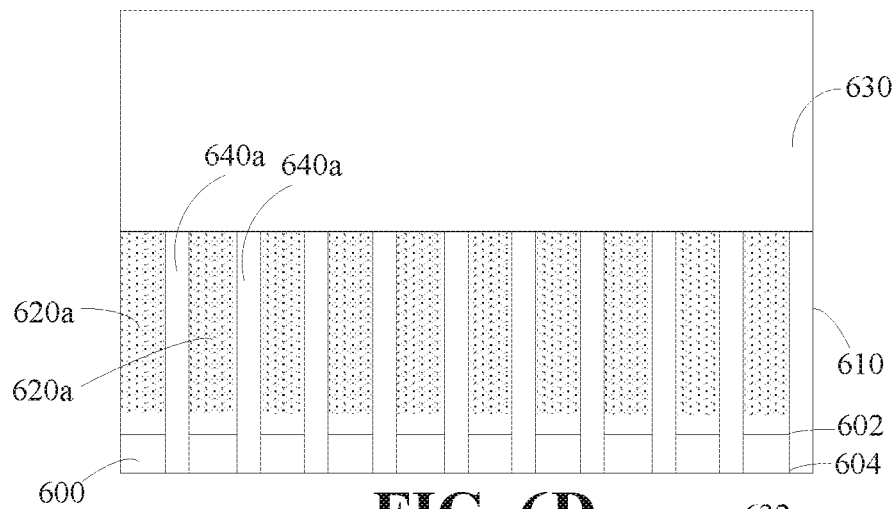

Referred to FIG. 6D, a second epitaxial layer 630 may be epitaxially grown on the first epitaxial layer 610 by a second epitaxial growth process. The second epitaxial layer 630 may be epitaxially aligned with the first epitaxial layer 610. The thickness of the second epitaxial layer may range from 2-4 um. In some embodiment, the thickness of the second epitaxial layer 630 may be substantially the same as the first epitaxial layer 610. In some embodiment, the second epitaxial layer 630 may be doped with dopant of first conductive type (e.g., P-type) same as the first epitaxial layer 610. In some embodiment, the second epitaxial layer 630 may have substantially the same doping concentration as the first epitaxial layer 610.

In block 750, a plurality of second front-side deep trench isolation (F-DTI) structures is formed on the second epitaxial layer based on the positions of the plurality of second front-side deep trench isolation (F-DTI) structures. Each of the second F-DTI structures is extended from the surface of the second epitaxial layer toward the second side of the semiconductor substrate. Each of the second F-DTI structures is substantially aligned with each of the plurality of first F-DTI structures. Each of the second front-side deep trench isolation structures is configured to extend through the second epitaxial layer and in contact with each of the plurality of first front-side deep trench isolation structures.

Figure 6E:
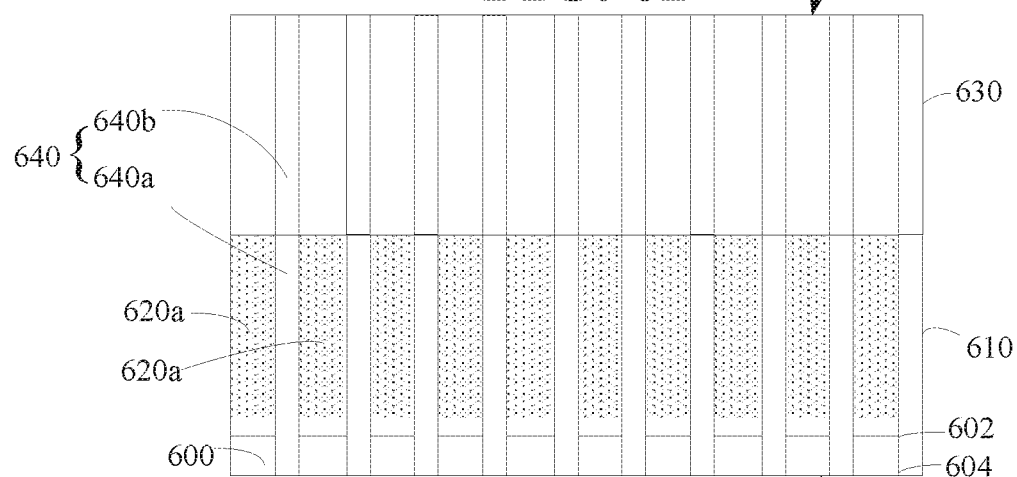

Referred to FIG. 6E, a plurality of second front-side deep trench isolation (F-DTI) structures 640b of the plurality of pixel isolation structures 640 is formed in the second epitaxial layer 630. Each of plurality of the second F-DTI structures 640b may be configured to extend through the second epitaxial layer 630 to structurally connect with each respect first F-DTI structure 640a.

In some embodiments, each of plurality of the second F-DTI structures 640b of the plurality of pixel isolation structures 640 may be formed by first patterning on the second epitaxial layer 630 with photoresist (positive or negative) based on the position of the plurality of first F-DTI structures 640a. Then, etching from a surface 623 of the second epitaxial layer 630 through the second epitaxial layer 630 to form a plurality of deep trench structures extended toward the second side 604 (backside) of the semiconductor substrate 600 by a dry or a wet etching process. Subsequently, deposit a second dielectric material in the plurality of deep trench structures to form the plurality of the second F-DTI structures 640b. In some embodiments, the dielectric material may be a dielectric material having a refractive index lower than the second epitaxial layer 630, such as silicon oxide. In some embodiments, the dielectric material may be a dielectric material having a dielectric constant greater than 3.9 or high k material, such as aluminum oxide ($Al_2O_3$), hafnium oxide ($HfO_2$), tantalum pentoxide ($Ta_2O_5$), zirconium dioxide ($ZrO_2$) or the combination thereof.

In some embodiments, the plurality of second F-DTI structures 640b may be formed by patterning the second epitaxial layer 630 and etching a plurality of deep trench structures from the second epitaxial layer 630 toward the first epitaxial layer 610. Subsequently, deposit a second dielectric material as lining layer and then filled with conductive material, such as metal.

In block 760, a plurality of second diffusion regions of the plurality of photodiodes is formed in the second epitaxial layer based on the position of the plurality of second front-side deep trench isolation (F-DTI) structures. Each of plurality of the second diffusion regions is extended through the second epitaxial layer and electrically connected to each of the first diffusion regions, correspondingly. In some embodiments, each of plurality of the second diffusion regions is extended through the second epitaxial layer and in contact with each of the first diffusion layer. Each of the second diffusion regions may be arranged to form in the space between two adjacent second F-DTI structures. Alternatively stated, each of second F-DTI structure may be arranged between adjacent second diffusion regions to electrically isolate the adjacent second diffusion regions. The plurality of second diffusion regions in the second epitaxial layer may be formed by masking and implanting dopant of second conductive type onto the second epitaxial layer.

Figure 6F:
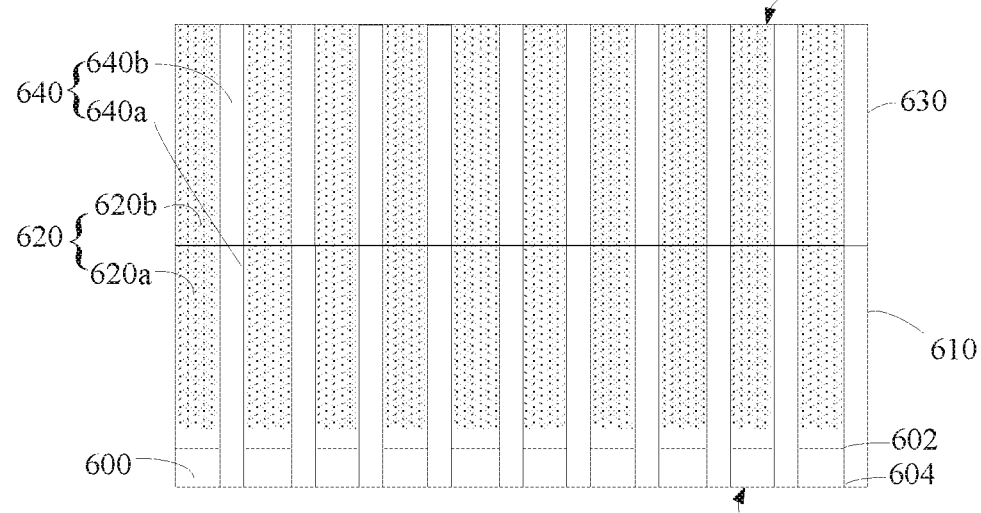

Referred to FIG. 6F, a plurality of second diffusion regions 620b of the plurality of photodiodes 620 is formed in the second epitaxial layer 610 based on the position of the plurality of second F-DTI structures 640b by a second ion implantation process. Each of plurality of the second diffusion regions 620b is extended through the second epitaxial layer 630 and electrically connected to each of the first diffusion regions 620b. In some embodiments, the implant depth (or the thickness) of each second diffusion regions 620a may range from 2-4 um.

In some embodiments, the second diffusion regions 620b of each photodiode 620 may be substantially aligned with the first diffusion regions 620a of each respective photodiode 620. Restated, each of the plurality of second diffusion regions 620b may be substantially aligned with each of the plurality of first diffusion regions 620a. In some embodiments, each of the first diffusion regions 610a and each of the second diffusion regions 620b may be misaligned by 0.05 um or less. Each of plurality of the second diffusion regions 620b may function as a second light sensing region of each respective photodiode 620.

In some embodiments, the first diffusion region 620a and the second diffusion region 620b of each photodiode 620 have substantially the same doping profile. In some embodiments, the first diffusion region 620a and the second diffusion region 620b have substantially the same doping concentration. Each photodiode 620 may have equal dopant concentrations and substantially the same size and shape, and each photodiode 620 may have substantially the same full well capacity. In some embodiments, for a backside illuminated image sensor, the first diffusion region 620a that is closer to the backside surface (e.g., surface 612) may have higher doping concentration than the second diffusion region 620b. In some embodiments, for a front-side illuminated image sensor, the second diffusion region 620b that is closer to the front side surface (e.g., surface 632) may have higher doping concentration than the first diffusion region 620a.

In some embodiments, the second diffusion regions 620b of each photodiode 620 is a second N-type diffusion region and the second epitaxial layer 630 is a second P-type epitaxial layer.

By fabricating image sensor with double epitaxial layer stack structure as illustrated in FIG. 7, a deeper photodiode along with deep trench isolation may be formed overcoming the current implantation and lithography processing limitation. For example, the overall implant depth (thickness) of each photodiode 620 may be increased at least by 2-3 um to range from 4-6 um, thereby enhancing light sensitivity to IR light.

In some embodiments, although not illustrated, to further extend the implant depth or the thickness of a photodiode, the image sensor structure depicted in FIG. 6 may further include a third epitaxial layer of the first conductive type (e.g., P-type) epitaxially grown onto the second epitaxial layer (e.g., the second epitaxial layer 630) by a third epitaxially growth process. A plurality of third diffusion regions of the second conductive type (e.g., N-type) and a plurality of third front-side deep trench isolation (F-DTI) structures may be formed in the third epitaxial layer. In some embodiments, the thickness of the third epitaxial layer may be substantially the same as the second epitaxial layer (e.g., the second epitaxial layer 630). In some embodiments, the third epitaxial layers may have substantially the same thickness as the second epitaxial layer (e.g., the second epitaxial layer 630).

Each of the third diffusion regions may be configured to extend through the third epitaxial layer and electrically coupled to each of the second diffusion regions (e.g., the second diffusion regions 620b). Each of the plurality of third diffusion regions may function as a third light sensing region of the plurality of photodiodes (e.g., the photodiodes 620). In other words, each of the photodiode (e.g., the photodiodes 620) may generate and accumulate image charges in response to incoming light impinged thereon and store the accumulated image charges in at least one of the first diffusion region 620a, the second diffusion region 620b and the third diffusion region.

Each of the plurality of third F-DTI structures may be configured to be substantially aligned with each of the second F-DTI structures. Each of the plurality of third F-DTI deep trench isolation structures may be configured to extend through the third epitaxial layer and structurally connect with each of the second F-DTI structures, wherein each of the third F-DTI structures may be configured to electrically isolate adjacent third diffusion regions. As such, the implant depth of a photodiode may be further extended.

It should be appreciated by one skilled in the art that without departing from the scope of present disclosure, the two or more epitaxial layer grown concept for forming deeper implant photodiode with deeper trench isolation structure may also applicable to front-side illuminated image sensor.

It should be further appreciated by one skilled in the art that the number of photodiodes (e.g., number of first and second diffusion regions) the number of pixel isolation structures, and/or the number of deep trench isolation structures shown in FIG. 1A-6F are merely used as illustration for describing various embodiments, and do not intend to limit the present disclosure.

Figure 8:
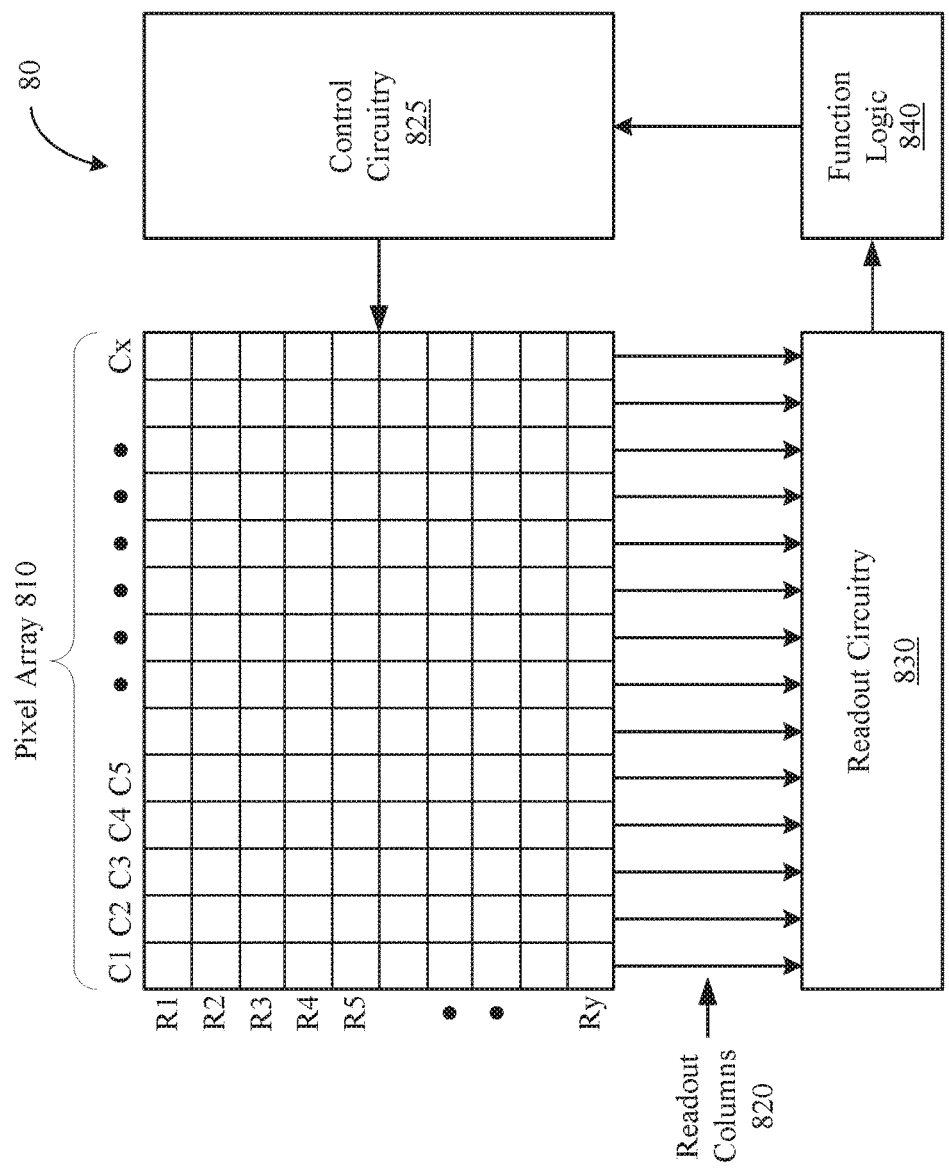
FIG. 8 illustrates one example of an imaging system in accordance with an embodiment of the present disclosure.

FIG. 8 illustrates one example of an imaging system 80 in accordance with an embodiment of the present disclosure. Imaging system 80 includes pixel array 810, control circuitry 825, readout circuitry 830, and function logic 840. In one example, pixel array 810 is a two-dimensional (2D) array of image sensor pixels (e.g., pixels P1, P2 . . . , Pn). Each image sensor pixel may include at least one photodiode (e.g., photodiode 120, 220, 520 or 620). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each photodiode/image sensor pixel in pixel array 810 has acquired its image charge through photo-generation of the image charge, corresponding image data is readout by readout circuitry 830 and then transferred to function logic 840. Readout circuitry 830 may be coupled to readout image data from the plurality of photodiodes (for example, photodiodes 120, photodiodes 220, photodiodes 520, or photodiodes 620) in pixel array 810. In various examples, readout circuitry 830 may include amplification circuitry, analog-to-digital (ADC) conversion circuitry, or otherwise. In one example, readout circuitry 830 may readout a row of image data at a time along readout column lines 820 (illustrated) or may readout the image data using a variety of other techniques (not illustrated), such as a serial readout or a full parallel readout of all pixels simultaneously. Function logic 840 may store the image data or even manipulate the image data by applying post image effects (e.g., crop, rotate, remove red eye, adjust brightness, adjust contrast, or otherwise).

In some embodiments, function logic 840 may require certain imaging conditions to be met and may therefore instruct the control circuitry 825 to manipulate certain parameters in pixel array 810 to achieve better qualities or special effects.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
   a semiconductor substrate having a first side and a second side opposite to the first side;
   a first epitaxial layer of a first conductive type, formed on the first side of the semiconductor substrate;
   a second epitaxial layer of the first conductive type, formed on the first epitaxial layer;
   a plurality of photodiodes, each photodiode comprising:
      a first diffusion region of a second conductive type, formed in the first epitaxial layer; and
      a second diffusion region of the second conductive type, formed in the second epitaxial layer, the second diffusion region being extended through the second epitaxial layer and electrically coupled to the first diffusion region;
      wherein each photodiode accumulates image charges generated in response to an incoming light in at least one of the first diffusion region and the second diffusion region; and
   a plurality of pixel isolation structures arranged between adjacent photodiodes, each pixel isolation structure comprising:
      a first isolation structure, formed in the first epitaxial layer, and being disposed between adjacent first diffusion regions; and
      a second isolation structure, formed in the second epitaxial layer and being disposed between adjacent second diffusion regions, the second isolation structure being extended through the second epitaxial layer toward the semiconductor substrate to connect to the first isolation structure.

2. The image sensor of claim 1, wherein the first diffusion region is aligned with the second diffusion region, the second diffusion region being configured to extend through the second epitaxial layer and in contact with the first diffusion region.

3. The image sensor of claim 1, further comprising
   a plurality of backside deep trench isolation structures formed on the second side of the semiconductor substrate, each of the deep trench isolation being extended from the second side of the semiconductor substrate into the first epitaxial layer to connect to the first isolation structure of each pixel isolation structure.

4. The image sensor of claim 3, wherein the first isolation structure comprises a first implant isolation region doped with the first conductive type, and the second isolation structure comprises a second implant isolation region doped with the first conductive type.

5. The image sensor of claim 4, wherein each of the backside deep trench isolation structures is extended from the second side of the semiconductor substrate into the first implant isolation region of the respective first isolation structure.

6. The image sensor of claim 1, wherein the first isolation structure comprises a first front-side deep trench isolation structure, and the first front-side deep trench isolation structure is extended through the first epitaxial layer toward the second side of the semiconductor substrate; wherein the second isolation structure comprises a second front-side deep trench isolation structure formed in the second epitaxial layer and the second front-side deep trench isolation structure is extended through the second epitaxial layer toward the semiconductor substrate to connect to the first front-side deep trench isolation structure.

7. The image sensor of claim 6, wherein the first deep trench isolation structure is filled with a first dielectric material, and the second deep trench isolation structure is filled with a second dielectric material.

8. The image sensor of claim 1, wherein the thickness of the first epitaxial layer is substantially the same as the thickness of the second epitaxial layer.

9. The image sensor of claim 1, wherein the plurality of photodiodes operatively receive the incoming light through the second side of the semiconductor substrate.

10. The image sensor of claim 1, wherein the plurality of photodiodes operatively receive the incoming light through a surface of the second epitaxial layer.

11. The image sensor of claim 1, wherein the plurality of photodiodes arranged to form a pixel array, the image sensor further comprising:
    a control circuitry coupled to the pixel array to control operation of the pixel array; and
    a readout circuitry coupled to the control pixel array to read out image data from the plurality of pixel cells.

12. An image sensor, comprising:
    a semiconductor substrate having a first side and a second side opposite to the first side;
    a first epitaxial layer of a first conductive type, formed on the first side of the semiconductor substrate, wherein the first epitaxial layer includes:
       a plurality of first diffusion region of a second conductive type opposite to the first conductive type; and
       a plurality of the first isolation structures, each of the first isolation structures being arranged between adjacent first diffusion regions in the first epitaxial layer to electrically isolate adjacent first diffusion regions; and
    a second epitaxial layer of the first conductive type, formed on the first epitaxial layer, wherein the second epitaxial layer includes:
       a plurality of second diffusion regions of the second conductive type, each of the second diffusion regions being extended through the second epitaxial layer and electrically coupled to each of the first diffusion regions forming a plurality of photodiodes; and
       a plurality of second isolation structures, each of the second isolation structures being arranged between adjacent second diffusion regions in the second epitaxial layer to electrically isolate adjacent second diffusion regions, each of the second isolation structures being extended through the second epitaxial layer toward the second side of the semiconductor substrate to connect to each of the first isolation structures.

13. The image sensor of claim 12, further comprising:
    a third epitaxial layer of the first conductive type, formed on the second epitaxial layer, wherein the third epitaxial layer includes
       a plurality of third diffusion regions of the second conductive type, each of the third diffusion region being extended through the third epitaxial layer and electrically coupled to the second diffusion region; wherein each of the photodiodes comprises the first diffusion region, the second diffusion region, and the third diffusion region; and
       a plurality of third isolations structure, each of the third isolation structures being disposed between adjacent third diffusion regions in the third epitaxial layer to electrically isolate adjacent third diffusion regions, each of the third isolation structures extended through the third epitaxial layer toward the second epitaxial layer to connect to each of the second isolation structures.

14. The image sensor of claim 12, further comprising:
a plurality of backside deep trench isolation structures formed on the second side of the semiconductor substrate, each of deep trench isolation structures being configured to extend from the second side of the semiconductor substrate into the semiconductor substrate to connect to each respective first isolation structure.

15. The image sensor of claim 14, wherein each of the plurality of first isolation structures comprises of a first implant isolation region doped with the first conductive type, and each of the plurality of second isolation structures comprises of a second implant isolation region doped with the first conductive type; wherein each of the backside deep trench isolation structures extended into the first implant isolation region of each respective first isolation structure.

16. The image sensor of claim 12, wherein each of the plurality of first isolation structures comprises a first front-side deep trench isolation extended through the first epitaxial layer toward the second side of the semiconductor substrate; wherein each of the plurality of second isolation structures comprises a second front-side deep trench isolation structure being extended through the second epitaxial layer to connect to each respective first front-side deep trench isolation structure.

17. A method of fabrication an image sensor, comprising:
forming a first epitaxial layer of a first conductive type on a first side of a semiconductor substrate;
forming a plurality of first diffusion regions of a second conductive type in the first epitaxial layer;
forming a plurality of first isolation structures in the first epitaxial layer, each first isolation structures being formed between adjacent first diffusion regions;
forming a second epitaxial layer of the first conductive type on the first epitaxial layer;
forming a plurality of second diffusion regions of the second conductive type in the second epitaxial layer, wherein each of the second diffusion regions is extended through the second epitaxial layer to electrically couple to each of the first diffusion regions forming a plurality of photodiodes; and
forming a plurality of second isolation structures in the second epitaxial layer, each of the second isolation structures being formed between adjacent second diffusion regions, each of second isolation structures extended through the second epitaxial layer to connect to each of the first isolation structures.

18. The method of claim 17, comprising:
forming a plurality of backside deep trench isolation structures on a second side of the semiconductor substrate opposite to the first side of the semiconductor substrate, each of the plurality of backside deep trench isolation structures extended from the second side of the semiconductor substrate toward the first epitaxial layer to connect to each respective first isolation structure.

19. The method of claim 18, wherein the process of forming the plurality of first isolation structures comprising implanting a plurality of first implant isolation regions of the first conductive type in the first epitaxial layer; wherein the process of forming the plurality of second isolation structures comprising implanting a plurality of second implant isolation regions of the first conductive type in the second epitaxial layer, wherein each of the plurality of second implant isolation regions is aligned with each of the first implant isolation regions, and each of the second implant isolation regions is implanted to extend through the second epitaxial layer to connect to the first implant isolation region.

20. The method of claim 17, wherein the process of forming the plurality of first isolation structures comprising forming a plurality of first front-side deep trench isolation structures in the first epitaxial layer, each of the plurality of first front-side deep trench isolation structures extended through the first epitaxial layer toward a second side of the semiconductor substrate; wherein the process of forming the plurality of second isolation structures comprising forming a plurality of second front-side deep trench isolation structures in the second epitaxial layer, each of the plurality of second front-side deep trench isolation structures extended through the second epitaxial layer to structurally connect to the first deep trench isolation structures, wherein each of the plurality of second front-side deep trench isolation structures is aligned with the plurality of first front-side deep trench isolation structures.

* * * * *

UNITED STATES PATENT AND TRADEMARK OFFICE
CERTIFICATE OF CORRECTION

| | |
|---|---|
| PATENT NO. | : 10,790,322 B1 |
| APPLICATION NO. | : 16/543681 |
| DATED | : September 29, 2020 |
| INVENTOR(S) | : Qin Wang and Gang Chen |

Page 1 of 1

It is certified that error appears in the above-identified patent and that said Letters Patent is hereby corrected as shown below:

In the Claims

Claim 11, Line 6, delete "the control" and substitute therefor --control the--
Claim 16, Lines 2-3, "a first front-side deep trench isolation" should read --a first front-side deep trench isolation structure--

Signed and Sealed this
Eleventh Day of May, 2021

Drew Hirshfeld
*Performing the Functions and Duties of the
Under Secretary of Commerce for Intellectual Property and
Director of the United States Patent and Trademark Office*